US012710497B2

(12) United States Patent
Hamilton et al.

(10) Patent No.: US 12,710,497 B2
(45) Date of Patent: Aug. 18, 2026

(54) SYSTEMS AND METHODS FOR CINE MAGNETIC RESONANCE FINGERPRINTING

(71) Applicants: The Regents of the University of Michigan, Ann Arbor, MI (US); Case Western Reserve University, Cleveland, OH (US); University Hospitals Cleveland Medical Center, Cleveland, OH (US)

(72) Inventors: Jesse Hamilton, Ann Arbor, MI (US); Gastao Lima da Cruz, Ann Arbor, MI (US); Sanjay Rajagopalan, Shaker Heights, OH (US); Nicole Seiberlich, Ann Arbor, MI (US); Imran Rashid, Beachwood, OH (US)

(73) Assignees: THE REGENTS OF THE UNIVERSITY OF MICHIGAN, Ann Arbor, MI (US); CASE WESTERN RESERVE UNIVERSITY, Cleveland, OH (US); UNIVERSITY HOSPITALS CLEVELAND MEDICAL CENTER, Cleveland, OH (US)

( * ) Notice: Subject to any disclaimer, the term of this patent is extended or adjusted under 35 U.S.C. 154(b) by 385 days.

(21) Appl. No.: 18/460,201

(22) Filed: Sep. 1, 2023

(65) Prior Publication Data

US 2025/0076433 A1 Mar. 6, 2025

(51) Int. Cl.
*G01R 33/48* (2006.01)
*G01R 33/561* (2006.01)
(Continued)

(52) U.S. Cl.
CPC ...... *G01R 33/4822* (2013.01); *G01R 33/5611* (2013.01); *G01R 33/56325* (2013.01);
(Continued)

(58) Field of Classification Search
None
See application file for complete search history.

(56) References Cited

U.S. PATENT DOCUMENTS 10,564,243 B2 * 2/2020 Griswold ............ G01R 33/543
12,181,554 B2 * 12/2024 Nezafat ................. G01R 33/50
(Continued)

OTHER PUBLICATIONS

Hsieh, et al., Magnetic resonance fingerprinting: from evolution to clinical application, J Med Radiat Sci 67 (2020) 333-344. (Year: 2020).*

(Continued)

*Primary Examiner* — Rodney E Fuller
(74) *Attorney, Agent, or Firm* — McCoy Russell LLP

(57) ABSTRACT

Methods and systems are provided for cine magnetic resonance fingerprinting (MRF). In one example, a method includes obtaining k-space data of an MRF scan of a subject, the k-space data acquired over a plurality of phases of at least one cardiac cycle of the subject, training an image reconstruction network (IRN) to output, for each phase, one or more subspace images of the subject using the k-space data, and training a parameter estimation network (PEN) to output, for each phase, a set of tissue parameter maps of the subject using the one or more subspace images output by the IRN for the corresponding phase. Upon training the IRN and the PEN, the method further includes obtaining (and displaying and/or saving in memory) a final set of tissue parameter maps of the subject for one or more or each of the plurality of phases.

18 Claims, 12 Drawing Sheets
(3 of 12 Drawing Sheet(s) Filed in Color)

(51) Int. Cl.

| | |
|---|---|
| ***G01R 33/563*** | (2006.01) |
| ***G01R 33/567*** | (2006.01) |
| ***G06T 7/00*** | (2017.01) |

(52) U.S. Cl.

CPC ........ *G01R 33/5673* (2013.01); *G06T 7/0012* (2013.01); *G06T 2207/10088* (2013.01); *G06T 2207/20081* (2013.01); *G06T 2207/30048* (2013.01)

(56) References Cited

U.S. PATENT DOCUMENTS

| | | | | |
|---|---|---|---|---|
| 2019/0353731 | A1 | 11/2019 | Liu et al. | |
| 2023/0243909 | A1 * | 8/2023 | Hamilton ............... | G01R 33/50<br>324/309 |
| 2023/0245354 | A1 | 8/2023 | Hamilton | |

OTHER PUBLICATIONS

Zhao, et al., Improved Magnetic Resonance Fingerprinting Reconstruction With Low-Rank and Subspace Modeling, Magnetic Resonance in Medicine 79:933-942 (2018). (Year: 2018).*

Hamilton, J. et al., “Machine Learning for Rapid Magnetic Resonance Fingerprinting (MRF) Tissue Property Quantification,” Proceedings of the IEEE, vol. 108, No. 1, Jan. 2020, Available as Early as Sep. 11, 2019, 16 pages.

Hamilton, J., “A Self-Supervised Deep Learning Reconstruction for Shortening the Breathhold and Acquisition Window in Cardiac Magnetic Resonance Fingerprinting,” Frontiers in Cardiovascular Medicine, vol. 9, No. 928546, Jun. 23, 2022, 20 pages.

Hamilton, J. et al., “MR Fingerprinting with a Deep Image Prior Reconstruction for Combined T1, T2, and M0 Mapping and Multi-Contrast Cine Imaging,” Proceedings of the ISMRM & ISMRT Annual Meeting and Exhibition, Jun. 3, 2023, Toronto, Canada, 9 pages.

* cited by examiner

1100

SYSTEMS AND METHODS FOR CINE MAGNETIC RESONANCE FINGERPRINTING

STATEMENT REGARDING FEDERALLY SPONSORED RESEARCH

This invention was made with government support under HL153034 and HL163030 awarded by the National Institutes of Health. The government has certain rights in the invention.

FIELD

Embodiments of the subject matter disclosed herein relate to medical imaging, and more specifically to cardiac magnetic resonance imaging.

BACKGROUND

Magnetic resonance imaging (MRI) is a medical imaging modality that can create images of the inside of a human body without using x-rays or other ionizing radiation. MRI uses the nuclear magnetic resonance (NMR) phenomenon to produce images. When a substance such as human tissue is subjected to a uniform magnetic field ($B_0$), the individual magnetic moments of the nuclei in the tissue attempt to align with this magnetic field, but precess about the field in random order at their characteristic Larmor frequency. If the tissue is subjected to an excitation magnetic field ($B_1$) that is in the x-y plane and that is near the Larmor frequency, the net aligned moment may be rotated, or "tipped," into the x-y plane to produce a net transverse magnetic moment. A signal is emitted by the excited nuclei or "spins," after the excitation signal $B_1$ is terminated, and this signal may be received and processed to form an image.

MRI can flexibly generate a variety of contrasts to accentuate different aspects of tissue composition, physiology, and structure. Contrast may be generated by a series of radiofrequency (RF) excitation pulses and magnetic field gradient pulses that are played out with specific timings and in a specific sequence. Upon preparation of the contrast, spatial information may be encoded into the signal to generate an image.

BRIEF DESCRIPTION

In one embodiment, a method for cine magnetic resonance fingerprinting (MRF) includes obtaining k-space data of an MRF scan of a subject, the k-space data acquired over a plurality of phases of at least one cardiac cycle of the subject, training an image reconstruction network (IRN) to output, for each phase of the plurality of phases, one or more subspace images of the subject using the k-space data, and training a parameter estimation network (PEN) to output, for each phase of the plurality of phases, a set of tissue parameter maps of the subject using the one or more subspace images output by the IRN for the corresponding phase. Upon training the IRN and the PEN, the method further includes obtaining a final set of tissue parameter maps of the subject for one or more or each of the plurality of phases and displaying and/or saving in memory the final set of tissue parameter maps for the one or more or each of the plurality of phases.

It should be understood that the brief description above is provided to introduce in simplified form a selection of concepts that are further described in the detailed description. It is not meant to identify key or essential features of the claimed subject matter, the scope of which is defined uniquely by the claims that follow the detailed description. Furthermore, the claimed subject matter is not limited to implementations that solve any disadvantages noted above or in any part of this disclosure.

BRIEF DESCRIPTION OF THE DRAWINGS

The patent or application file contains at least one drawing executed in color. Copies of this patent or patent application publication with color drawing(s) will be provided by the Office upon request and payment of the necessary fee.

The present disclosure will be better understood from reading the following description of non-limiting embodiments, with reference to the attached drawings, wherein below.

DETAILED DESCRIPTION

Figure 1:
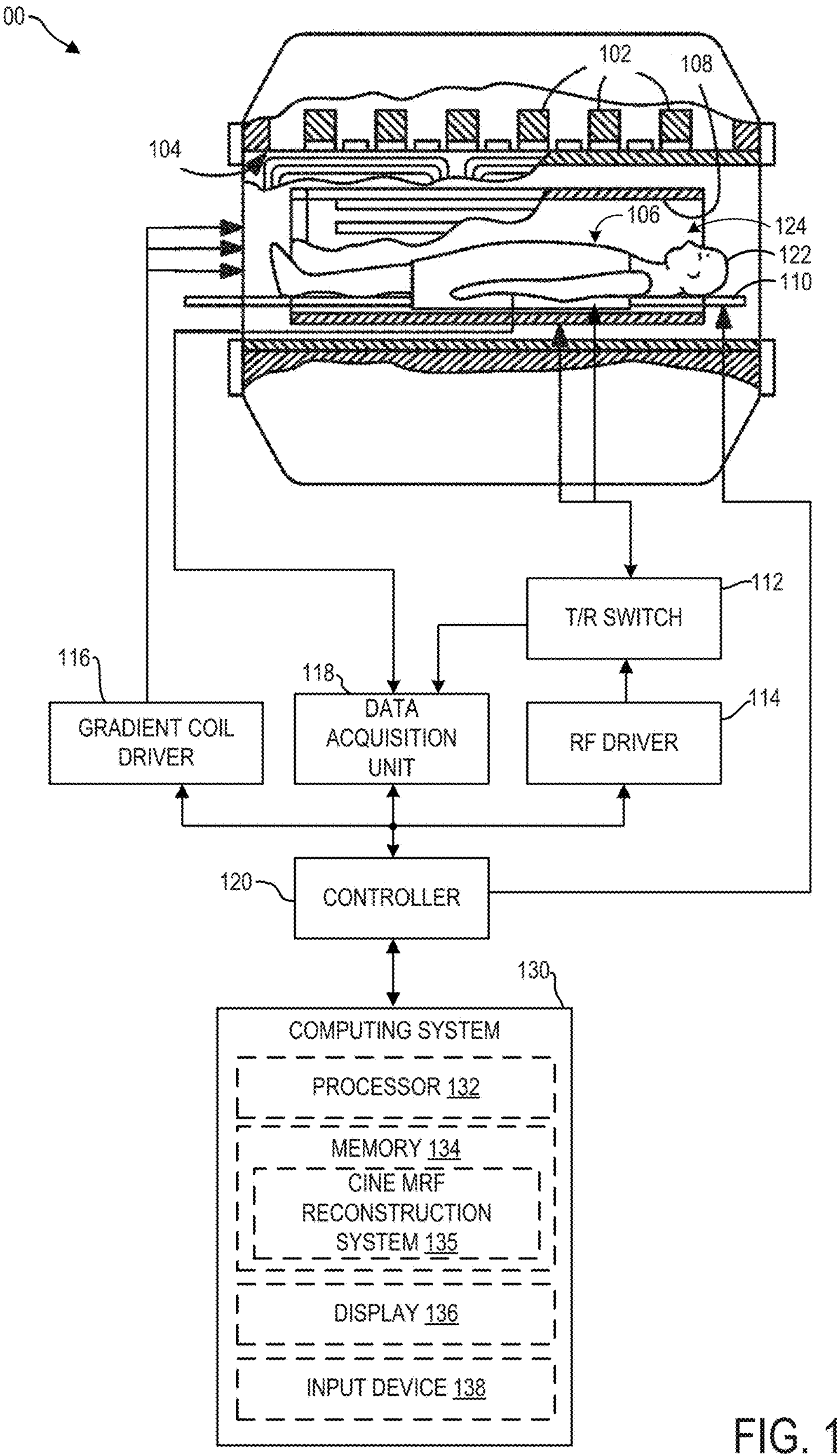
FIG. 1 is a block diagram of an MRI system according to an embodiment of the disclosure.

The following description relates to cine magnetic fingerprinting (MRF) reconstruction using a deep image prior approach that applies three networks, two of which are untrained and initialized with random values and trained de novo by enforcing consistency with undersampled k-space data from a current scan.

Magnetic resonance imaging (MRI) is a powerful diagnostic modality that can interrogate subject anatomy, function, and tissue properties. MRI may be employed to visualize the heart, referred to as cardiac MRI or CMR imaging. In cardiac MRI, multiple time-series images may be acquired over a period of time, referred to as cine MRI. Cine MRI is the gold standard for quantifying cardiac function and can be used to assess wall motion abnormalities. In addition to generating images, cardiac MRI may include parametric mapping, which may be employed to assess tissue properties based on different contrasts produced during an MR exam, such as $T_1$ and $T_2$ mapping. $T_1$ mapping can offer insights into focal and diffuse disease processes including infarct, fibrosis, inflammation, amyloidosis, and fat infiltration. $T_2$ mapping can help evaluate edema, acute inflammatory disease, and myocarditis, among other conditions.

Traditionally, cine imaging and parametric mapping are performed in separate acquisitions. Cine scans typically use a balanced steady-state free precession (bSSFP) sequence with breathholding and electrocardiogram (ECG) gating, with 1-2 slices collected per breathhold. Thus, multiple breathholds are needed to quantify function over the entire left ventricle (LV). $T_1$ and $T_2$ mapping are conventionally performed by collecting images at different time points during the recovery of longitudinal magnetization (for $T_1$) or decay of transverse magnetization (for $T_2$), followed by pixel-wise fitting to an exponential model to obtain a quantitative map. Conventional mapping techniques have several limitations, including low scan efficiency, mis-registration between maps acquired in separate breathholds, and sensitivity to confounding factors, including parameter interdependence.

Multiparametric techniques can potentially overcome these limitations by providing co-registered maps of multiple properties in a single acquisition. Approaches for simultaneous cardiac $T_1$ and $T_2$ mapping include CAI-BIRIA, QALAS, saturation and T2-prep based mapping, multiparametric SASHA, and magnetic resonance fingerprinting (MRF). In particular, MRF encodes $T_1$ and $T_2$ information in magnetization signal timecourses that are produced by variable excitations and timings, whereby highly undersampled images are matched to a dictionary to obtain quantitative maps. However, many of these techniques require prospective ECG triggering, which is inefficient as it limits data collection to one cardiac phase. Motion-resolved techniques have been proposed to improve scan efficiency by quantifying tissue properties over multiple cardiac phases, allowing for joint evaluation of cardiac function. Various methods have been developed for cine $T_1$ mapping, such as TOPAZ, model-based iterative reconstructions, SPARCS, and multitasking. Joint cine $T_1$ and $T_2$ mapping has been proposed using multitasking, free-running inversion recovery and $T_2$-preparation with nonrigid motion correction, and cine magnetic resonance fingerprinting (MRF).

Previous approaches for cine MRF employed a continuous acquisition with retrospective ECG gating, followed by a low-rank image reconstruction with non-rigid cardiac motion correction to improve signal-to-noise ratio (SNR). Cine MRF has been demonstrated at 1.5 T using a radial bSSFP sequence with a relatively long breathhold of 29 seconds and low temporal resolution of 8 cine phases, and at 3 T using a spiral fast imaging with steady-state precession (FISP) sequence with a shorter breathhold of 11 seconds and higher temporal resolution of 24 cine phases. However, accurately estimating the parameters for non-rigid cardiac motion correction remains challenging in MRF due to variable contrast weightings, residual aliasing artifacts, and low SNR. Additionally, motion-corrected methods may not capture potential changes in $T_1$ or $T_2$ throughout the cardiac cycle, as images from multiple phases are registered to a single phase before dictionary matching.

Free-running 2D acquisitions may also be sensitive to errors from $B_1^+$ inhomogeneities, through-plane motion, and blood flow. Myocardial tissue may move in and out of the excited slice volume with each cardiac contraction by up to 10 mm for the left ventricle, causing deviations between the measured and simulated signal evolutions. Similar discrepancies occur for blood that flows into the slice, which will not have experienced the previous RF excitations.

This, according to embodiments disclosed herein, a cine MRF reconstruction system may be applied for 2D cine MRF $T_1$, $T_2$, and $M_0$ mapping and synthetic bright-blood and dark-blood cine imaging during a relatively short (e.g., 11-second) breathhold, which enables improved image quality and precision compared to previous low-rank and motion-corrected techniques. The cine MRF reconstruction system includes an image reconstruction network and a parameter estimation network, each of which do not require prior training, and applies low-rank subspace modeling to generate cardiac phase-resolved maps without motion correction. In addition, a cine map of the effective $B_1^+$ may be estimated to reduce errors in $T_1$ and $T_2$ estimates due to RF transmit inhomogeneities, through-plane motion, and inflowing blood. The cine map of the effective $B_1^+$ may correct for the $B_1^+$ spin history. The $B_1^+$ spin history reflects the instantaneous $B_1^+$ due to spatial inhomogeneities in the RF transmit field and the time-cumulative RF excitations experienced by spins moving in and out of the slice volume throughout the scan, thus absorbing errors due to through-plane motion and flow.

Figure 2:
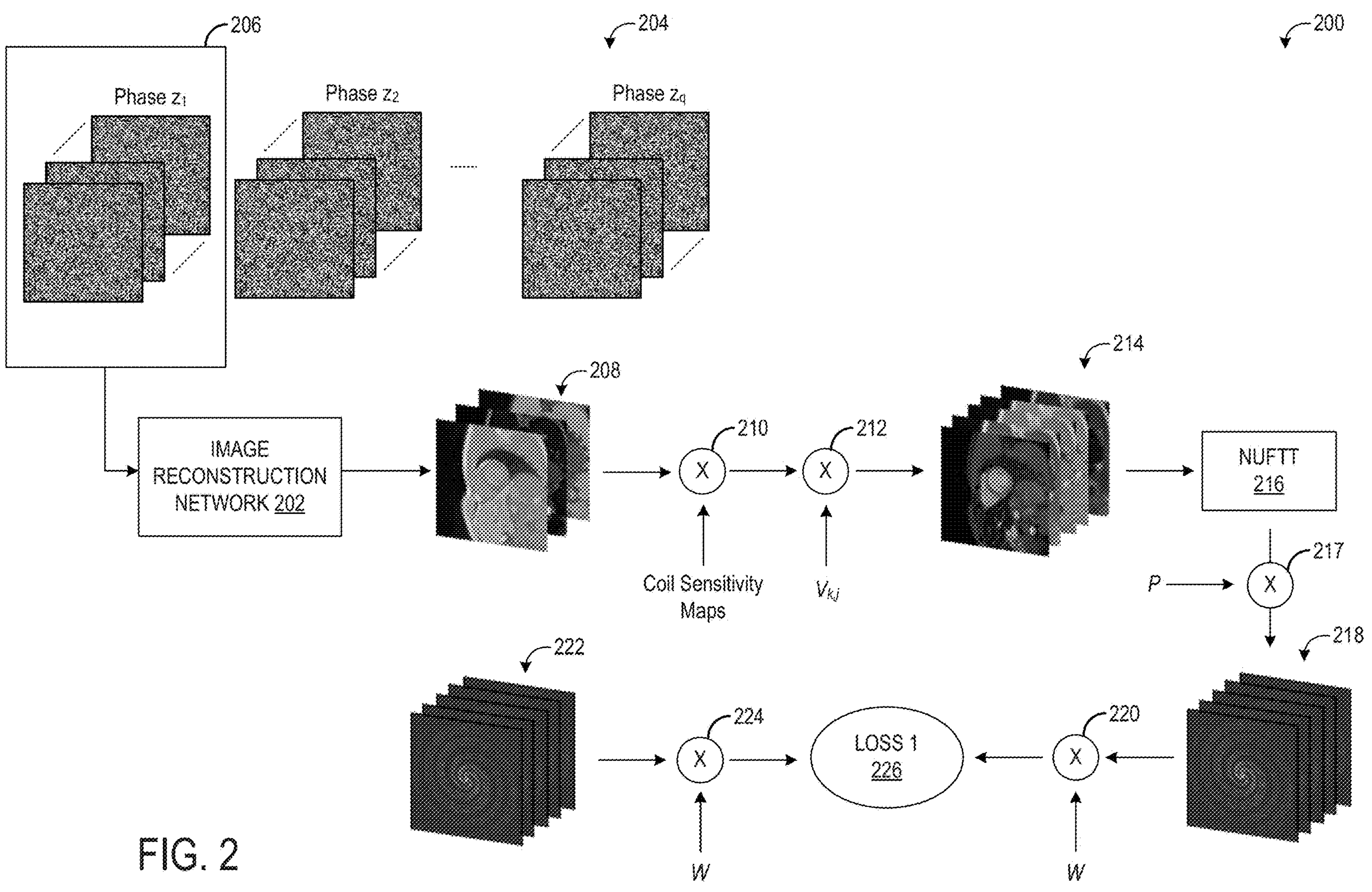
FIG. 2 depicts an example block flow diagram for training an image reconstruction network of a cine magnetic resonance fingerprinting (MRF) reconstruction system according to an embodiment of the disclosure.
Figure 3:
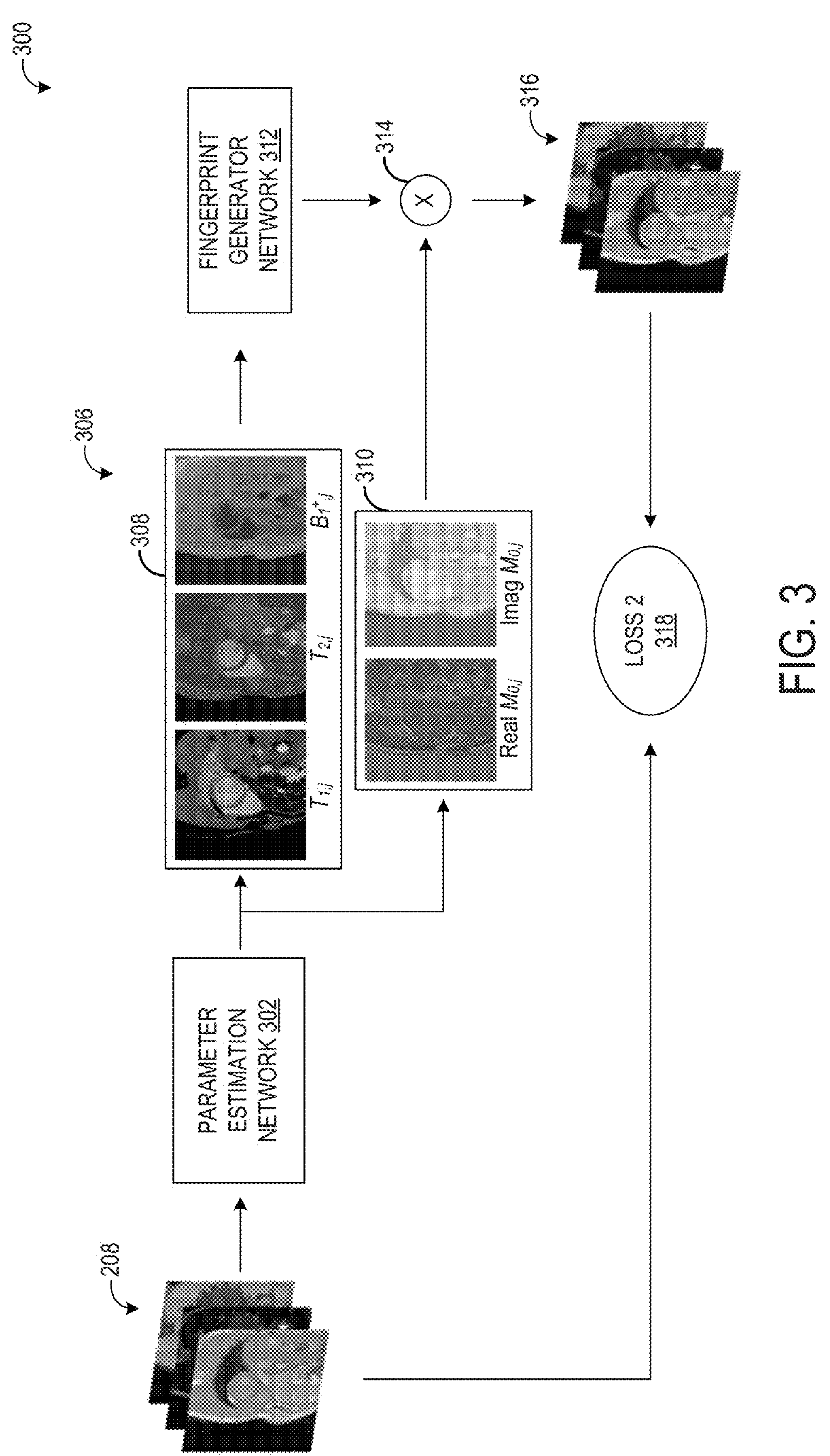
FIG. 3 depicts an example block flow diagram for training a parameter estimation network of the cine MRF reconstruction system according to an embodiment of the disclosure.
Figure 8:
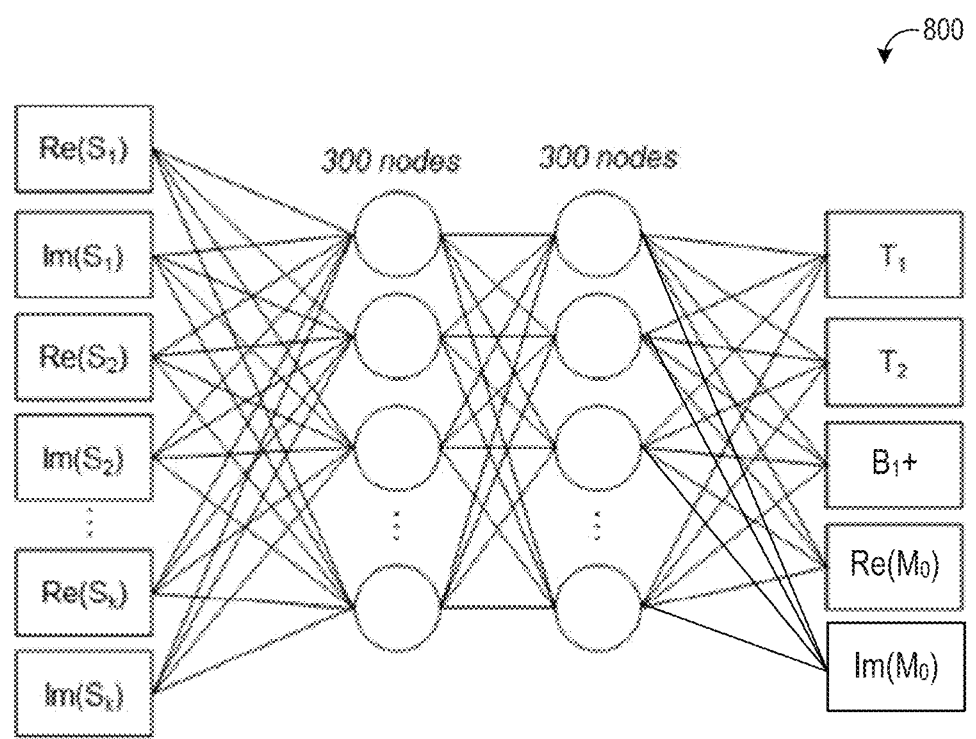
FIG. 8 illustrates an example architecture for a parameter estimation network, according to an embodiment of the disclosure.
Figure 9:
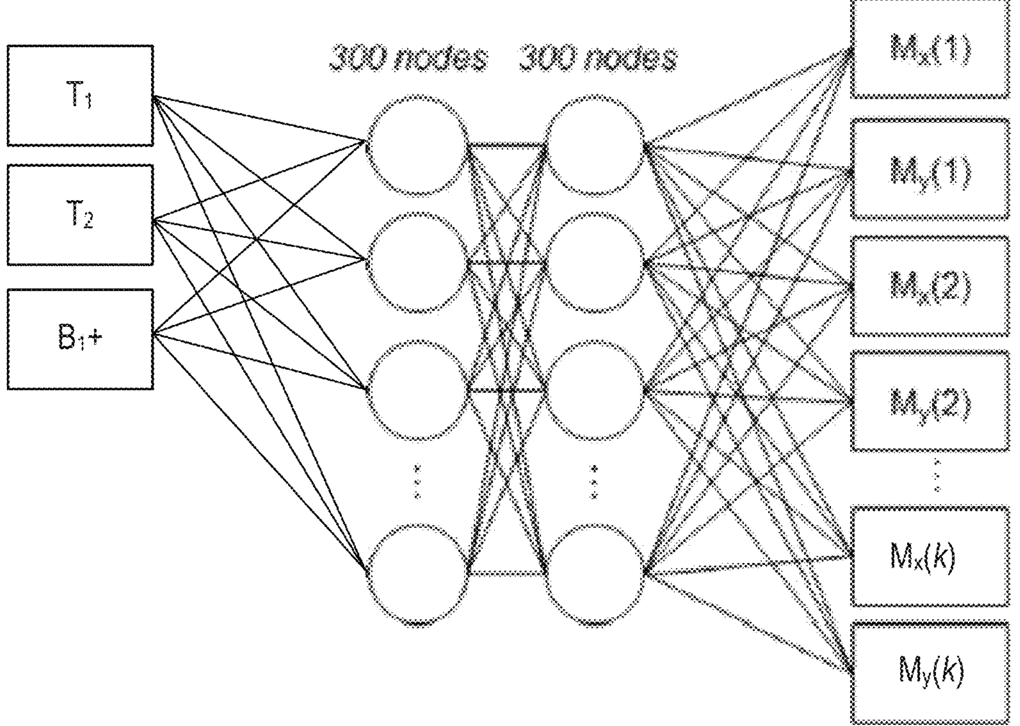
FIG. 9 illustrates an example architecture for a fingerprint generator network, according to an embodiment of the disclosure.
Figure 10:
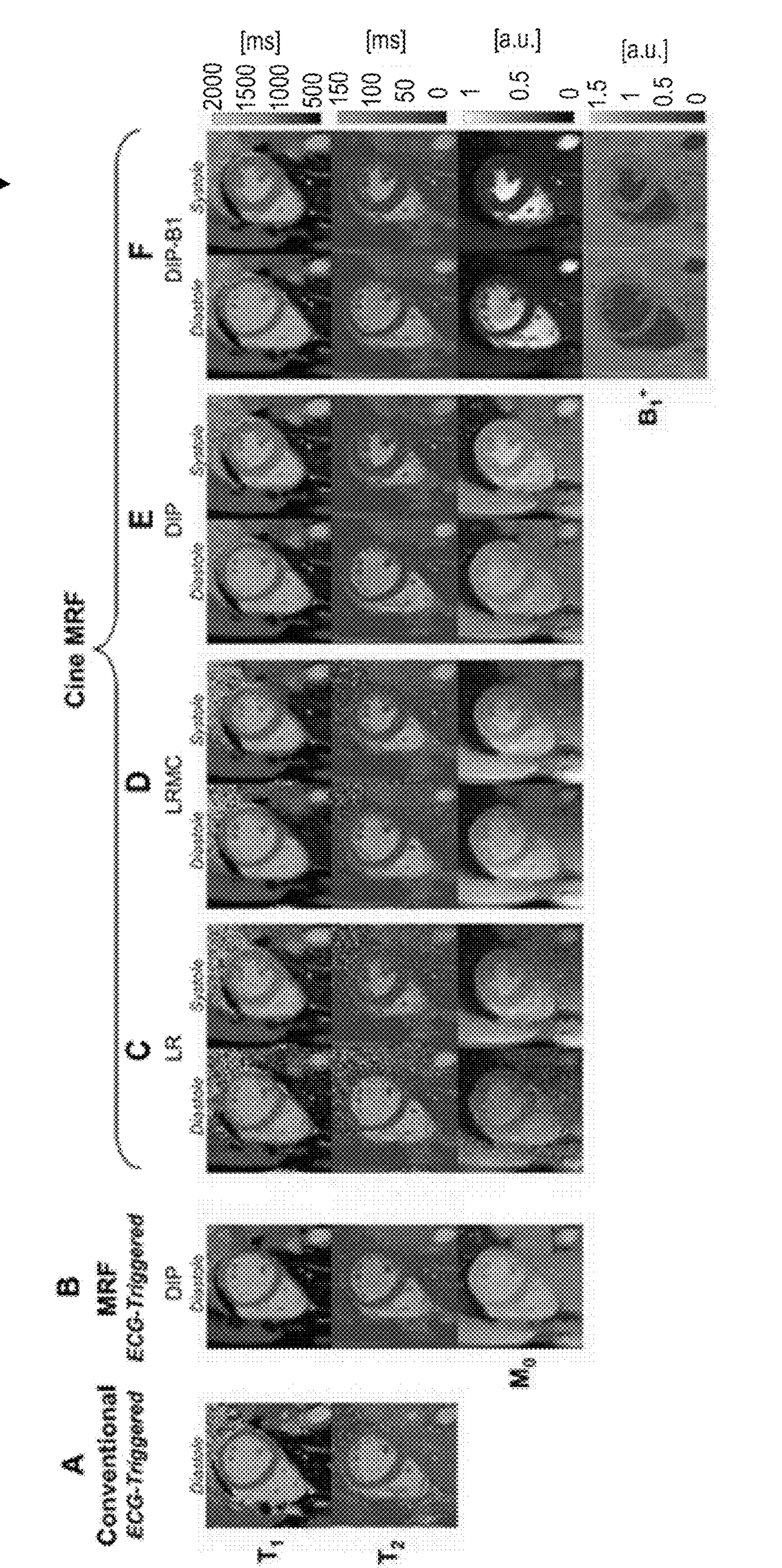
FIG. 10 illustrates example parameter maps generated according to embodiments of the disclosure.
Figure 11:
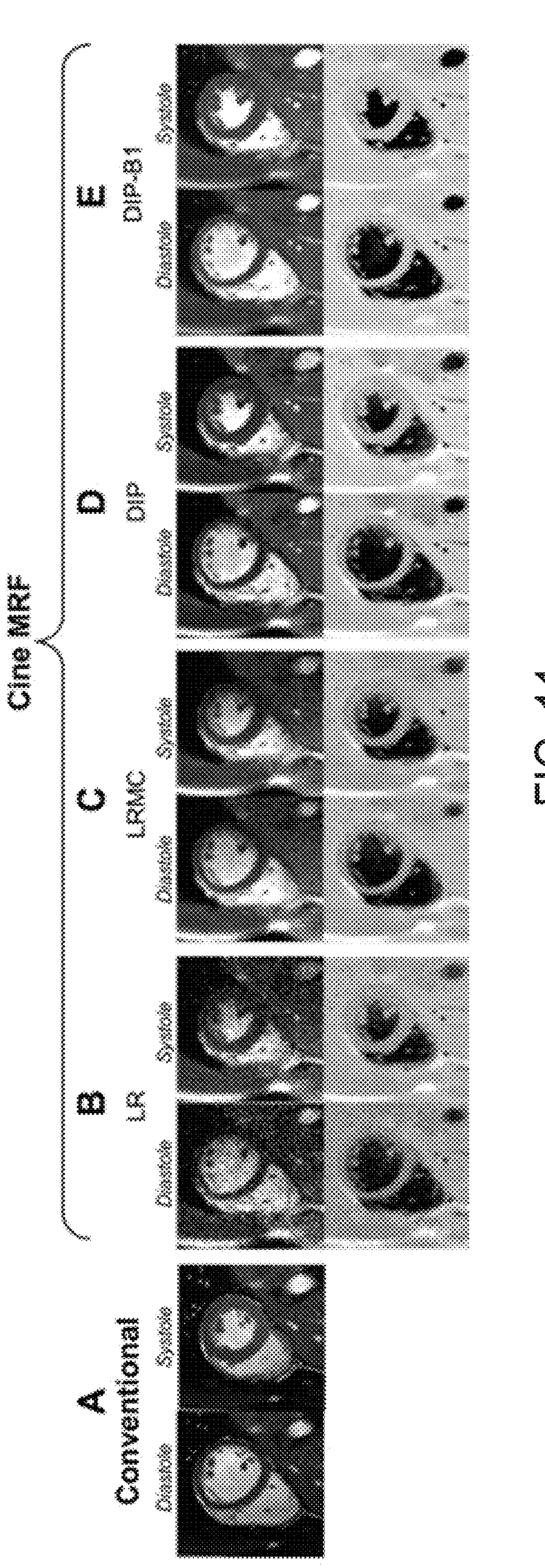
FIG. 11 illustrates example synthetic images generated according to embodiments of the disclosure.

An example MRI system that may be utilized to obtain MR data (e.g., k-space data) is shown in FIG. 1. The MRI system may include a computing device that may be configured to store and execute the cine MRF reconstruction system. As mentioned above, the cine MRF reconstruction system may include two untrained networks that are trained de novo for each imaging subject. FIG. 2 schematically shows a process for training an image reconstruction network of the cine MRF reconstruction system using the acquired k-space data of the subject to enforce data consistency. FIG. 3 schematically shows a process for training a parameter estimation network of the cine MRF reconstruction system using the output of the image reconstruction network and a pre-trained fingerprint simulator. An example architecture of the parameter estimation network is shown in FIG. 8 and an example architecture of the fingerprint simulator is shown in FIG. 9, each of which may account for effective $B_1^+$. Once trained, the image reconstruction network and parameter estimation network may be deployed to generate $B_1^+$-corrected parameter maps of any cardiac phase of the subject, as shown schematically in FIG. 4. FIGS. 5A-7 are flow charts illustrating various methods that may be executed by the cine MRF reconstruction system in order to generate parameter maps and/or synthetic images of a subject by training an image reconstruction network and parameter estimation network using acquired k-space data of the subject. Example parameter maps and synthetic images that may be generated by the cine MRF reconstruction system are shown in FIGS. 10 and 11.

FIG. 1 illustrates an MRI system 100 that includes a static magnetic field magnet 102, a gradient magnetic field coil 104, an RF receiver coil unit 106, an RF transmitter coil unit 108, a patient table 110, a transmit/receive (T/R) switch 112, an RF driver 114, a gradient coil driver 116, a data acquisition unit 118, a controller 120, and a computing system 130.

The static magnetic field magnet 102 includes, for example, a superconductive magnet, a permanent magnet, or the like. The magnet defines a cylindrical space surrounding a subject 122 and generates a constant primary static magnetic field $B_0$.

The gradient magnetic field coil 104 forms a gradient magnetic field in an imaging space 124 so as to provide the magnetic resonance signals (which will be received by the RF receiver coil unit) with three-dimensional positional information. The gradient magnetic field coil 104 includes three gradient coil systems, each of which generates a gradient magnetic field along a respective one of three spatial axes perpendicular to each other. For example, the gradient magnetic field coil 104 is formed by combining three coils (an X-axis gradient magnetic field coil, a Y-axis gradient magnetic field coil, a Z-axis gradient magnetic field coil) corresponding to respective axes of X, Y, and Z that are perpendicular to each other. These three coils generate a gradient magnetic field, the magnetic field intensity of which vary along the respective axes of X, Y, and Z, each receiving a separate supply of an electric current from the gradient magnetic field power source. The Z-axis direction is the same direction as the static magnetic field. Moreover, the Y-axis direction is a vertical direction, and the X-axis direction is a direction perpendicular to the Z axis and the Y axis.

Thus, the gradient magnetic field coil 104 generates a gradient field in each of a frequency encoding direction (e.g., along the read-out axis and thus also referred to as Gr), a phase encoding direction (e.g., along the phase-encode axis and thus also referred to as Gp), and a slice selection direction (e.g., along the slice-select axis and thus also referred to as Gs) in accordance with a specified pulse sequence (which may be dictated by a scan protocol or prescription). More specifically, the gradient magnetic field coil 104 applies a gradient field in the slice selection direction (or scan direction) of the subject 122, to select the slice (e.g., the gradient magnetic field for slice selection is used to determine an imaging section); and the RF transmitter coil unit 108 may transmit an RF pulse to a selected slice of the subject 122. The gradient magnetic field coil 104 also applies a gradient field in the phase encoding direction of the subject 122 to phase encode the magnetic resonance signals from the slice excited by the RF pulse (e.g., the gradient magnetic field for phase encoding is used to change a phase of an MR signal according to a spatial position). The gradient magnetic field coil 104 also applies a gradient field in the frequency encoding direction of the subject 122 (also referred to as a readout direction) to frequency encode the magnetic resonance signals from the slice excited by the RF pulse (e.g., the magnetic field for readout is used to change a frequency of an MR signal according to a spatial position).

In some embodiments, the RF receiver coil unit 106 is a surface coil, which is a local coil typically placed proximate to the anatomy of interest of the subject 122. The RF receiver coil unit 106 may include one or more RF coil elements, e.g., an array of coil elements. Herein, the RF transmitter coil unit 108 is a transmit coil that transmits RF signals, and the local surface RF receiver coil unit 106 receives the MR signals. As such, the transmit coil and the surface receive coil are separate but electromagnetically coupled components.

The RF transmitter coil unit 108 is disposed, for example, to enclose the imaging space 124, and produces RF magnetic field pulses orthogonal to the main magnetic field $B_0$ produced by the static magnetic field magnet 102 within the imaging space 124 to excite the nuclei. In the static magnetic field space or imaging space 124 where a static magnetic field $B_0$ is formed by the static magnetic field magnet 102, the RF transmitter coil unit 108 transmits, based on a control signal from the controller 120, an RF pulse that is an electromagnetic wave to the subject 122 and thereby generates a high-frequency magnetic field $B_1$. This excites proton spins (also referred to as "magnetization") in the slice to be imaged of the subject 122. The RF receiver coil unit 106 receives, as a magnetic resonance signal, the electromagnetic wave generated when the proton spins thus excited in the slice to be imaged of the subject 122 returns into alignment with the initial magnetization vector. The RF receiver coil unit 106 is disposed, for example, to enclose the region to be imaged of the subject 122. In some examples, the RF receiver coil unit 106 may be referred to as the surface coil or the receive coil. In some embodiments, the RF receiver coil unit 106 may transmit the RF pulse and receive the MR signal. In other embodiments, the RF receiver coil unit 106 may only be used for receiving the MR signals, but not transmitting the RF pulse.

In contrast to the RF receiver coil unit 106, which may be disconnected from the MRI system 100 and replaced with another RF coil unit, the RF transmitter coil unit 108 is fixedly attached and connected to the MRI system 100. Furthermore, whereas local coils such as the RF receiver coil unit 106 can transmit to or receive signals from only a localized region of the subject 122, the RF transmitter coil unit 108 generally has a larger coverage area. The RF transmitter coil unit 108 may be used to transmit or receive signals to the whole body of the subject 122, for example.

Thus, the MRI system 100 transmits electromagnetic pulse signals to the subject 122 placed in the imaging space 124 with the static magnetic field formed therein to perform a scan for obtaining magnetic resonance signals from the subject 122. One or more images of the subject 122 can be reconstructed based on the magnetic resonance signals thus obtained by the scan.

The T/R switch 112 can selectively electrically connect the RF transmitter coil unit 108 to the data acquisition unit 118 when operating in receive mode, and to the RF driver 114 when operating in transmit mode. Similarly, the T/R switch 112 can selectively electrically connect the RF receiver coil unit 106 to the data acquisition unit 118 when the RF receiver coil unit 106 operates in receive mode, and to the RF driver 114 when operating in transmit mode. When the RF receiver coil unit 106 and the RF transmitter coil unit 108 are both used in a single scan, for example if the RF receiver coil unit 106 is configured to receive MR signals and the RF transmitter coil unit 108 is configured to transmit RF signals, then the T/R switch 112 may direct control signals from the RF driver 114 to the RF transmitter coil unit 108 while directing received MR signals from the RF receiver coil unit 106 to the data acquisition unit 118.

The RF driver 114 is used to drive the RF coils (e.g., RF transmitter coil unit 108) and form a high-frequency magnetic field in the imaging space 124. The RF driver 114 modulates, based on a control signal from the controller 120 and using a gate modulator, the RF signal received from an RF oscillator into a signal of predetermined timing having a predetermined envelope. The RF signal modulated by the gate modulator is amplified by an RF power amplifier and then output to the RF transmitter coil unit 108.

The gradient coil driver 116 drives the gradient magnetic field coil 104 based on a control signal from the controller 120 and thereby generates a gradient magnetic field in the imaging space 124. The gradient coil driver 116 includes three systems of driver circuits (not shown) corresponding to the three gradient coil systems included in the gradient magnetic field coil 104.

The data acquisition unit 118 includes circuitry (e.g., a pre-amplifier, a phase-sensitive detector, an analog/digital converter) used to acquire the magnetic resonance signals received by the RF receiver coil unit 106. In the data acquisition unit 118, the phase-sensitive detector detects, using the output from the RF oscillator of the RF driver 114 as a reference signal, the magnetic resonance signals received from the RF receiver coil unit 106 and amplified by the pre-amplifier, and outputs the detected phase-sensitive analog magnetic resonance signals to the analog/digital converter for conversion into digital signals. The digital signals thus obtained are output to the computing system 130.

The MRI system 100 includes a table 110 for placing the subject 122 thereon. The subject 122 may be moved inside and outside the imaging space 124 by moving the table 110 based on control signals from the controller 120.

The controller 120 includes a processor configured to execute machine readable instructions stored in a non-transitory memory. The memory may comprise, for example, a semiconductor memory device, such as a random-access memory (RAM) and a flash memory, a hard disk, an optical disk, a ROM, flexible disk, magneto-optical disk, CD-ROM, or non-volatile memory card. The controller 120 is connected to the computing system 130 and processes the operation signals input to the computing system 130 and furthermore outputs control signals to controls the table 110, RF driver 114, gradient coil driver 116, and data acquisition unit 118. The controller 120 also controls, to obtain a desired image, the computing system 130.

The computing system 130 includes a user input device 138, such as a touchscreen, keyboard, and/or a mouse. The input device 138 is used by an operator, for example, to input such data as an imaging protocol and to set a region where an imaging sequence is to be executed. The data about the imaging protocol and the imaging sequence execution region are output to the controller 120.

The computing system 130 includes a processor 132 configured to execute machine readable instructions stored in a non-transitory memory 134. The computing system 130 is connected to the controller 120 and performs data processing based on control signals received from the controller 120. The computing system 130 is also connected to the data acquisition unit 118 and generates spectrum data by applying various image processing operations to the magnetic resonance signals output from the data acquisition unit 118. In some examples, memory 134 may store instructions executable by processor 132 to perform the methods disclosed herein, such as the methods of FIGS. 5A-7. In particular, memory 134 may store a cine MRF reconstruction system 135 that includes three networks (an image reconstruction network, a parameter estimation network, and a fingerprint generator network) configured to generate motion-resolved parameter maps and/or synthetic images from undersampled k-space data obtained according to a cine MRF protocol, as explained in more detail below. In some examples, all components of the cine MRF reconstruction system 135 (e.g., the three networks, instructions for training and deploying the networks, instructions for generating the synthetic images, an MRF dictionary, etc.) may be stored in memory 134 of computing system 130. In other examples, at least some aspects of the cine MRF reconstruction system 135 may be stored on a separate computing system that is in communication with MRI system 100, such as a server, on a distributed computing system (e.g., the cloud), etc.

The computing system 130 includes a display device 136 that displays an image on the display screen of the display device based on control signals received from the controller 120. The display 136 displays, for example, motion-resolved parameter maps and/or synthetic images generated from the motion-resolved parameter maps. The display 136 may also display a two-dimensional (2D) slice image or three-dimensional (3D) image of the subject 122 generated by the computing system 130. For example, the processor 132 may execute instructions stored in memory 134 to perform one or more image reconstruction techniques on the data received from the data acquisition unit 118 in order to form the motion-resolved parameter maps and/or other images, process the maps and/or images (e.g., remove image artifacts from the images), store the maps and/or images in memory, display the maps and/or images via display 136, and/or send the maps and/or images to a remote image storage device.

FIG. 2 schematically shows a first training process 200 for training an image reconstruction network (IRN) 202 of a cine MRF reconstruction system, such as the cine MRF reconstruction system 135. The first training process 200 may be carried out using an MRI system, such as MRI system 100 of FIG. 1. The IRN 202 may be a neural network, such as a 2D convolutional u-net. At the beginning of the first training process 200, the IRN 202 may be untrained. For example, the IRN 202 may be initialized with randomly-selected weights and biases and trained in a subject-specific manner according to the first training process 200. An MRI scan may be conducted on the subject using a suitable cine MRF protocol, such as spiral fast imaging with steady-state precession (FISP). The k-space data acquired during the MRI scan may be acquired across at least one cardiac cycle of the subject and in some examples may be acquired across multiple (e.g., five) cardiac cycles of the subject. The k-space data may be partitioned into a plurality of phases corresponding to the cardiac cycle of the subject. For example, an electrocardiogram (ECG) signal of the subject may be obtained during the MRI scan and used to retrospectively gate the k-space data. In an example, the subject's RR interval may be determined from the ECG signal and the k-space data may be sorted into 24 cardiac phases by dividing each RR interval into bins of equal width. The phase-sorted k-space data of the subject may be used to facilitate self-supervised learning of the IRN 202, thereby negating the need for ground truth data.

In order to train the IRN 202 to be able to generate images from any cardiac phase of the subject, the IRN 202 may be trained using a plurality of input tensors 204 that includes a different input tensor for each cardiac phase. Let $z_j \in \mathbb{R}^{n_y \times n_x \times d}$ denote the input for phase j, where $n_y$ and $n_x$ are the matrix size, and d is an adjustable parameter defining the number of feature maps in the input (e.g., 32). The input tensors for the first cardiac phase ($z_1$) and the last cardiac phase ($z_q$) are initialized with random values between −1 and 1, and the input tensors for intermediate phases are calculated by linear interpolation, which imposes regularization along the cardiac motion dimension. Thus, as shown in FIG. 2, the input tensor for the first cardiac phase (phase $z_1$) may include a set of feature maps, with each having a matrix of random values. In this way, the input tensor for the first cardiac phase (e.g., the first input tensor) may be a 3D matrix with random values. The input tensor for the last cardiac phase (phase $z_q$) may include a set of features maps each having a matrix of random values. In this way, the input tensor for the last cardiac phase (e.g., the last input tensor) may be a 3D matrix with random values. Linear interpolation may be performed between the first input tensor and the last input tensor to generate a respective input tensor for each of a plurality of intermediate phases (e.g., phase $z_2$, phase $z_3$, until phase $z_{q-1}$). Thus, a plurality of intermediate input tensors may be generated. The plurality of input tensors may include the first input tensor, the plurality of intermediate input tensors, and the last input tensor, which may thereby simulate cardiac motion. In an example, the cardiac cycle may be defined as including 24 phases and hence input tensors for 22 intermediate phases may be generated.

During each training iteration, data from one cardiac phase j is treated as a mini-batch. The corresponding input tensor $z_j$ is input to the IRN 202 to generate subspace images $x_{k,j}$ for this cardiac phase.

$$x_{k,j} = IRN(z_j) \quad \text{[eq. 1]}$$

For example, during a first iteration of the first training process 200, the first phase may be selected and a first input tensor 206 corresponding to the first phase may be entered as input to the IRN 202. The IRN 202 may output one or more subspace images 208 based on the first input tensor 206. The one or more subspace images may also be referred to as spatial basis images or singular value images and may be low resolution/compressed images.

In some examples, the IRN 202 performs a series of 2D convolutions followed by batch normalization, leaky ReLU activation, and an optional dropout layer. The data (e.g., the input tensor) pass through five downsampling and upsampling paths with multiple skip connections. Downsampling may be implemented using convolution with a 2×2 stride, and upsampling may be performed using nearest neighbor interpolation followed by convolution. The network output from the IRN 202 may have a size $n_y \times n_x \times 2k$, where the channel dimension includes the interleaved real and imaginary parts of the subspace images.

Self-supervised training is performed by processing the one or more subspace images (e.g., the one or more subspace images 208) into synthetic k-space data utilizing a forward encoding model, which includes coil sensitivities, a low-rank MRF signal approximation, and spiral k-space sampling. For example, as shown in FIG. 2, the one or more subspace images 208 are multiplied by coil sensitivity maps at block 210 and the output from block 210 is multiplied by the low-rank MRF signal approximation at block 212 to generate time-series images 214. The coil sensitivity maps may reflect the sensitivity of each RF coil used to obtain the k-space data of the subject and may be generated during a pre-scan calibration or based on the k-space data of the subject used to train the IRN 202, for example. For each subspace image, the coil sensitivity maps may be multiplied by the subspace image in a pixel-wise fashion and combined in a suitable manner to form the output of block 210. The low-rank MRF signal approximation, denoted $V_{k,j}$, and also referred to as a temporal basis function, may be determined from a singular value decomposition (SVD) of a dictionary of fingerprints (e.g., an MRF dictionary) created to derive the temporal basis function. Multiplication by the low-rank MRF signal approximation/temporal basis function may transform the images from the subspace to the time domain. For example, the MRF dictionary can be compressed along time using a truncated SVD that retains only the first k singular values. The MRF dictionary may include MRF signal evolutions as a function of combinations of $T_1$, $T_2$, and $B_1^+$ values.

The time-series images 214 are transformed to k-space using a non-uniform fast Fourier transform (NUFFT) 216, creating time-series k-space frames and the k-space data for time frame i is multiplied by a spiral undersampling mask P for the corresponding time frame at block 217 (e.g., each k-space frame is multiplied by a respective spiral undersampling mask). In some examples, only a subset of the k-space frames of the time-series of k-space frames is utilized for training to reduce memory and processing demands. Further, in some examples, the temporal basis function ($V_k$) used to generate time-series data may be applied to the k-space data after transformation and the selection of the subset of k-space frames may be achieved by using $V^*_{i,k}$ instead of $V_k$, where $V^*_{i,k}$ denotes the ith column vector from $V^*_k$ (note that multiplication by $V^*_{i,k}$ projects data from the subspace to the time domain and extracts only the ith time frame).

A density compensation factor W is applied at block 220 to the masked k-space frames 218 to generate density-compensated synthetic k-space data. The density compensation factor W, spiral undersampling mask P, and in some examples the coil sensitivity maps may be generated from the k-space data acquired of the subject (e.g., the acquired k-space data, the first phase of which is illustrated in FIG. 2 as acquired k-space data 222).

To avoid time-consuming operations using the NUFFT, the acquired k-space data may be preprocessed using GRAPPA operator gridding (GROG), a parallel imaging technique that shifts non-Cartesian k-space data to unmeasured Cartesian locations using generalized autocalibrating partially parallel acquisitions (GRAPPA) weight matrices. The weight matrices for unit shifts along $k_x$ and $k_y$ are calibrated using a fully-sampled dataset; this dataset is obtained by taking the temporal average of the multi-coil MRF k-space data (e.g., the acquired k-space data), gridding a time-averaged image using the NUFFT, and performing an FFT to obtain multi-coil Cartesian k-space data. The central 48×48 region of the Cartesian k-space is used for GROG calibration. The coil sensitivity maps may be estimated from the time-averaged multi-coil images using an adaptive combination method. The GROG density compensation function, denoted by W, may be obtained by counting the number of spiral k-space points that are shifted to each Cartesian coordinate. After calibration, the GROG weights are applied to shift undersampled spiral k-space data onto a Cartesian grid, and each time frame of the resulting Cartesian k-space dataset is multiplied by W. The spiral undersampling mask, which may be a binary mask and denoted by $P_i$, is stored that indicates the sampled (acquired) points on the Cartesian grid at each time index i.

Thus, the acquired k-space data 222 for the first phase is processed by applying the density compensation factor W at block 224, similar to the processing of the masked k-space frames 218.

A first loss function 226 is applied on the output of block 224 and the output of block 220 (e.g., density-compensated acquired k-space data and density-compensated synthetic k-space data). The first loss function 226 may be a mean squared error (MSE) loss calculated at the sampled locations in k-space after multiplication by the density compensation function W. The IRN 202 is updated based on the first loss function 226 (e.g., the IRN 202 may be updated based on a first loss determined by applying the first loss function 226).

Only the IRN weights are updated during training, while the inputs $z_j$ remained fixed.

$$\min_{IRN}\left\|Wy_j - WFS\left(x_{k,j}(V_{k,j})^H\right)\right\|_2^2 \quad \text{[eq. 2]}$$

The first training process 200 is repeated for a plurality of iterations with a different phase used as input for each iteration. For example, in the next iteration, the input tensor for the second phase ($z_2$) is used as input, with acquired k-space data of the subject corresponding to the second phase used for calculating the first loss via the first loss function. Once each input tensor/phase has been used for training, the process repeats for the next iteration using the first input tensor/phase, then the second input tensor/phase, and so forth. A total of 30,000 iterations may be performed, in some examples.

FIG. 3 schematically shows a second training process 300 for training a parameter estimation network (PEN) 302 of the cine MRF reconstruction system (e.g., of the cine MRF reconstruction system 135). The second training process 300 may be carried out using an MRI system, such as MRI system 100 of FIG. 1. The PEN 302 may be a neural network, such as a fully connected network. At the beginning of the second training process 300, the PEN 302 may be untrained. For example, the PEN 302 may be initialized with randomly-selected weights and biases and trained in a subject-specific manner according to the second training process 300. The second training process 300 may be performed in parallel to the first training process 200.

The second training process 300 specifically illustrates the first iteration of training the PEN 302. The subspace images 208 output by the IRN 202, corresponding to the first cardiac phase, are entered as input to the PEN 302. The PEN 302 is configured to output a plurality of tissue parameter maps 306 based on the input subspace images 208. The plurality of tissue parameter maps 306 includes a first set of maps 308 and a second set of maps 310. The first set of maps 308 includes a $T_1$ map, a $T_2$ map, and a $B_1^+$ map each corresponding to the current phase j. The second set of maps 310 includes proton density ($M_0$) maps corresponding to the current phase j. The proton density includes real and imaginary components and thus the proton density maps include a real map (Real $M_0$) and imaginary map (Imag $M_0$).

Thus, the PEN 302 outputs quantitative $T_1$, $T_2$, $B_1^+$, and $M_0$ maps from the subspace images. The PEN 302 may include two hidden layers with 300 nodes per layer, in some examples. Before being input to the PEN 302, the subspace images may be vectorized to have size $(n_y n_x)\times(2k)$, where the second (channel) dimension contains interleaved real and imaginary signal intensities. The network output has one channel for each tissue property. $M_0$ may be modeled as a complex-valued scaling factor between the measured and simulated fingerprints, and thus the output of the PEN 302 has five channels for $T_1$, $T_2$, $B_1^+$, and the real and imaginary parts of $M_0$. In this way, the PEN 302 is configured to perform voxelwise estimation of $T_1$, $T_2$, $M_0$ (modeled as a complex scaling factor), and the effective $B_1^+$ from the subspace images of a given cardiac phase.

The PEN 302 is trained in a self-supervised manner based on synthetic subspace images generated by processing the $T_1$, $T_2$, $M_0$, and $B_1^+$ maps. The synthetic subspace images are compared to the subspace images 208 generated by the IRN 202 in the first training process 200 using a second loss function (e.g., an MSE loss) and the second loss determined by applying the second loss function is used to update the PEN 302. One approach to calculate the synthetic subspace images would be to project the tissue parameter maps onto the MRF dictionary, replacing each pixel location with a signal from the MRF dictionary based on its $T_1$, $T_2$, and $B_1^+$ value. However, this step is executed repeatedly during training and projecting the tissue parameter maps onto the MRF dictionary is time and resource intensive. A more efficient strategy shown in FIG. 3 includes the use of a pre-trained neural network referred to as a Fingerprint Generator Network (FGN) 312 that is trained to utilize the $T_1$, $T_2$, and $B_1^+$ values as inputs and generate MRF signal evolutions (in the subspace), which eliminates the need for dictionary searching and expedites training. The FGN 312 is trained using the SVD-compressed MRF dictionary (including $B_1^+$ values).

The FGN 312 may be a fully-connected network with two hidden layers and 300 nodes per layer, at least in some examples. The input to the FGN 312 includes a $T_1$ value, a $T_2$ value, and a $B_1^+$ value. The output of the FGN 312 may be a vector of length 2k containing interleaved real and imaginary parts of the fingerprint/MRF signal evolution. The pre-training of the FGN 312 may be performed only one time using fingerprints/MRF signal evolutions produced by a Bloch equation simulation for different $T_1$, $T_2$, and $B_1^+$ values, after which the same pre-trained network can be applied to any subsequent scan regardless of the subject's cardiac rhythm.

The output of the FGN 312 includes simulated fingerprints (in the low-dimensional subspace) at each voxel location. These fingerprints are multiplied by the complex-valued $M_0$ map at block 314 to form synthetic subspace images. A second loss function 318 is applied on the synthetic subspace images and the subspace images 208 output by the IRN 202 to generate a second loss for updating the weights of the PEN 302. The PEN training is represented by the following equations, where $T_1$,j, $T_2$,j, $M_0$,j, and $B_{1,j}^+$ denote the maps for cardiac phase j.

$$T_{1,j},\ T_{2,j},\ M_{0,j},\ B_{1,j}^{+} = PEN(x_{k,j}) \quad \text{[eq. 3]}$$

$$\min_{PEN}\left\|x_{k,j} - M_{0,j}FGN\left(T_{1,j},\ T_{2,j},\ B_{1,j}^{+}\right)\right\|_2^2 \quad \text{[eq. 4]}$$

The second training process 300 is repeated for a plurality of iterations with a different phase used as input for each iteration. For example, in the next iteration, the subspace images for the second phase ($z_2$) output by the IRN are used as input. Once the subspace images corresponding to each phase have been used for training, the process repeats for the next iteration using the subspace images for the first phase, then the second phase, and so forth. Thus, for each iteration of training the IRN 202, an iteration of training the PEN 302 is performed using the subspace images output by the IRN 202 for that iteration.

Figure 4:
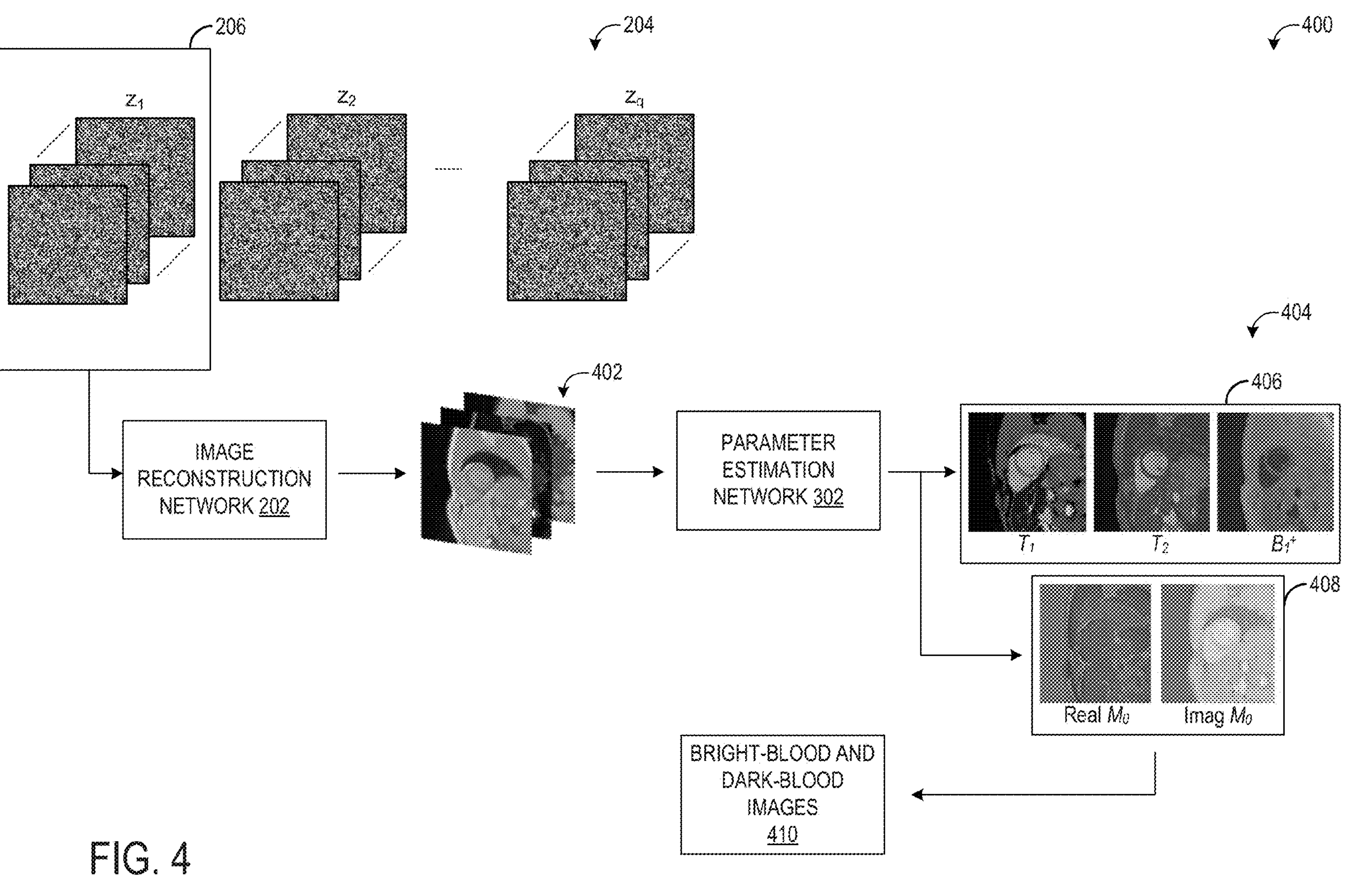
FIG. 4 depicts an example block flow diagram for deploying the trained image reconstruction network and parameter estimation network of the cine MRF reconstruction system according to an embodiment of the disclosure.

Once the IRN 202 and PEN 302 are trained, final motion-resolved tissue parameter maps may be obtained. FIG. 4 schematically shows a high-level process 400 for obtaining motion-resolved tissue parameter maps using the cine MRF reconstruction system (e.g., the cine MRF reconstruction system 135). An input tensor from the set of input tensors may be selected and input to the IRN 202. As shown, the first input tensor 206 is input to the IRN 202. The IRN 202 outputs subspace images 402 based on the first input tensor 206. The subspace images 402 may be different than the subspace images 208 output during the first training iteration, as the IRN 202 has undergone training (including updates to the weights of the IRN 202), and thus may more accurately reflect the imaged features of the subject as enforced by the acquired k-space data of the subject. The subspace images 402 are entered into the PEN 302, which outputs a final set of tissue parameter maps 404 based on the subspace images 402. As explained above with respect to FIG. 3, the final set of tissue parameter maps may include a first set of parameter maps 406 that includes a $T_1$ map, a $T_2$ map, and a $B_1^+$ map and a second set of parameter maps 408 that includes a real $M_0$ map and an imaginary $M_0$ map. Similar to the IRN 202, the PEN 302 has undergone training and thus the final set of tissue parameter maps 404 may be more accurate than the set of tissue parameter maps 306 output during the first iteration of training (e.g., due to the updated weights of the PEN 302). The final set of tissue parameter maps 404 may be displayed on a display device and/or stored in memory. In some examples, the final set of tissue parameter maps 404 may be used to generate synthetic images including bright-blood images and/or dark-blood images 410, which may also be displayed and/or saved in memory.

The high-level process 400 may be repeated for each phase, such that a final set of tissue parameter maps and optionally the bright-blood and/or dark-blood images may be generated for each cardiac phase. However, a final set of tissue parameter maps and optionally the bright-blood and/or dark-blood images may be generated for any desired cardiac phase. For example, a user may select a cardiac phase (e.g., the first phase, the second phase, a tenth phase, or any of the 24 phases) and the input tensor corresponding to the selected phase may be input to the IRN 202 in order to generate the final tissue parameter maps for the selected phase.

While the high-level process 400 shown in FIG. 4 illustrates the final tissue parameter maps being generated using only the trained IRN 202 and PEN 302, it is to be appreciated that in some examples the final tissue parameter maps (e.g., the final set of tissue parameter maps 404) may be generated during a final set of iterations of the training processes described with respect to FIGS. 2 and 3. For example, during the final 1,000 iterations of training the IRN 202 and PEN 302, the tissue parameter maps output by the PEN 302 for a given phase (e.g., the first phase) may be saved and the final tissue parameter maps for the given phase obtained by applying an exponential average with a weight of 0.99 to the saved tissue parameter maps to smooth out instabilities during training due to stochastic gradient descent. As a specific example, if the tissue parameter maps are resolved to 24 cardiac phases, the final 1,000 iterations may generate 41 sets of tissue parameter maps for the first phase and a final set of tissue parameter maps for the first phase may be obtained by performing the exponential average of the 41 sets of tissue parameter maps for the first phase (e.g., the final $T_1$ map may be an exponential average of the 41 $T_1$ maps generated during the final 1,000 iterations of training the IRN 202 and PEN 302).

Figure 5A:
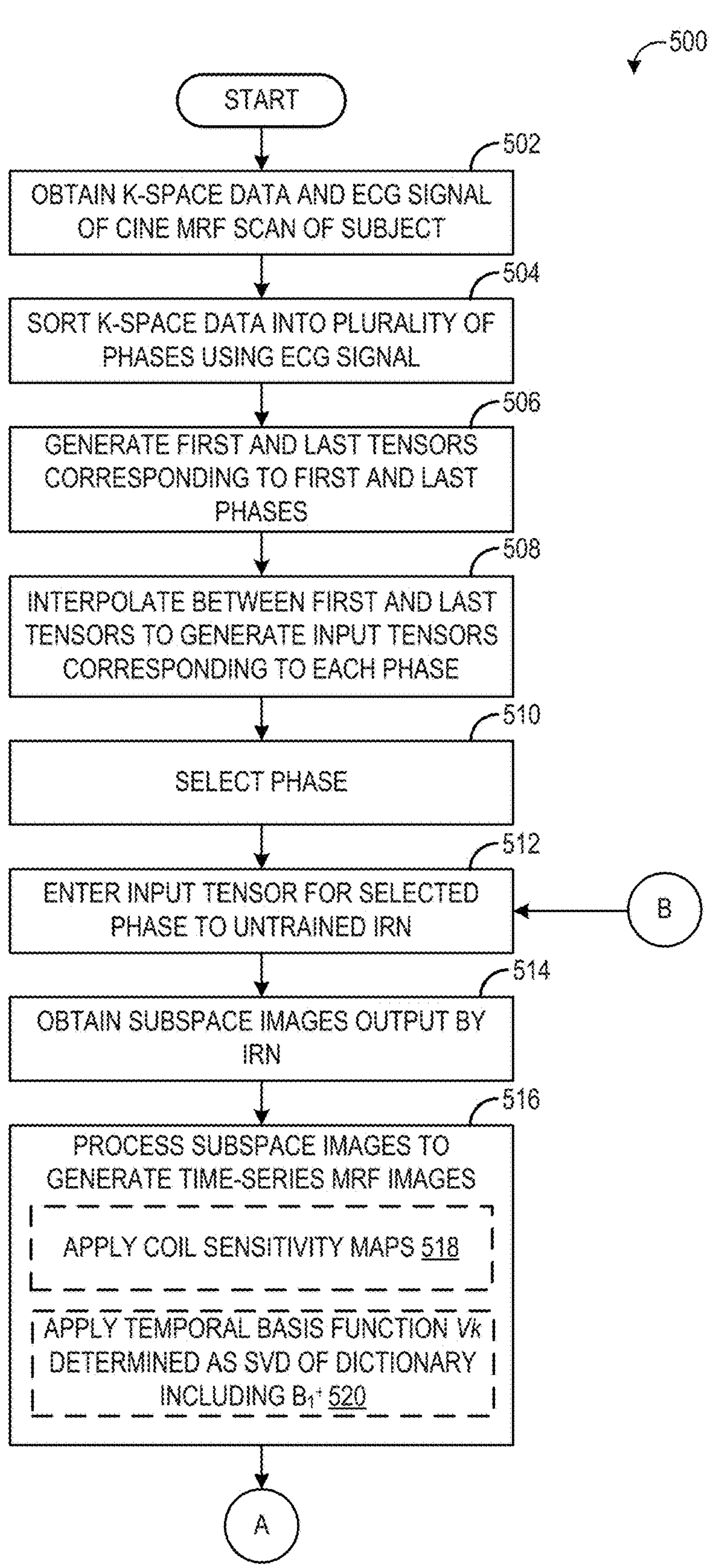
FIGS. 5A and 5B are a flow chart illustrating an example method for training an image reconstruction network according to an embodiment of the disclosure.
Figure 5B:
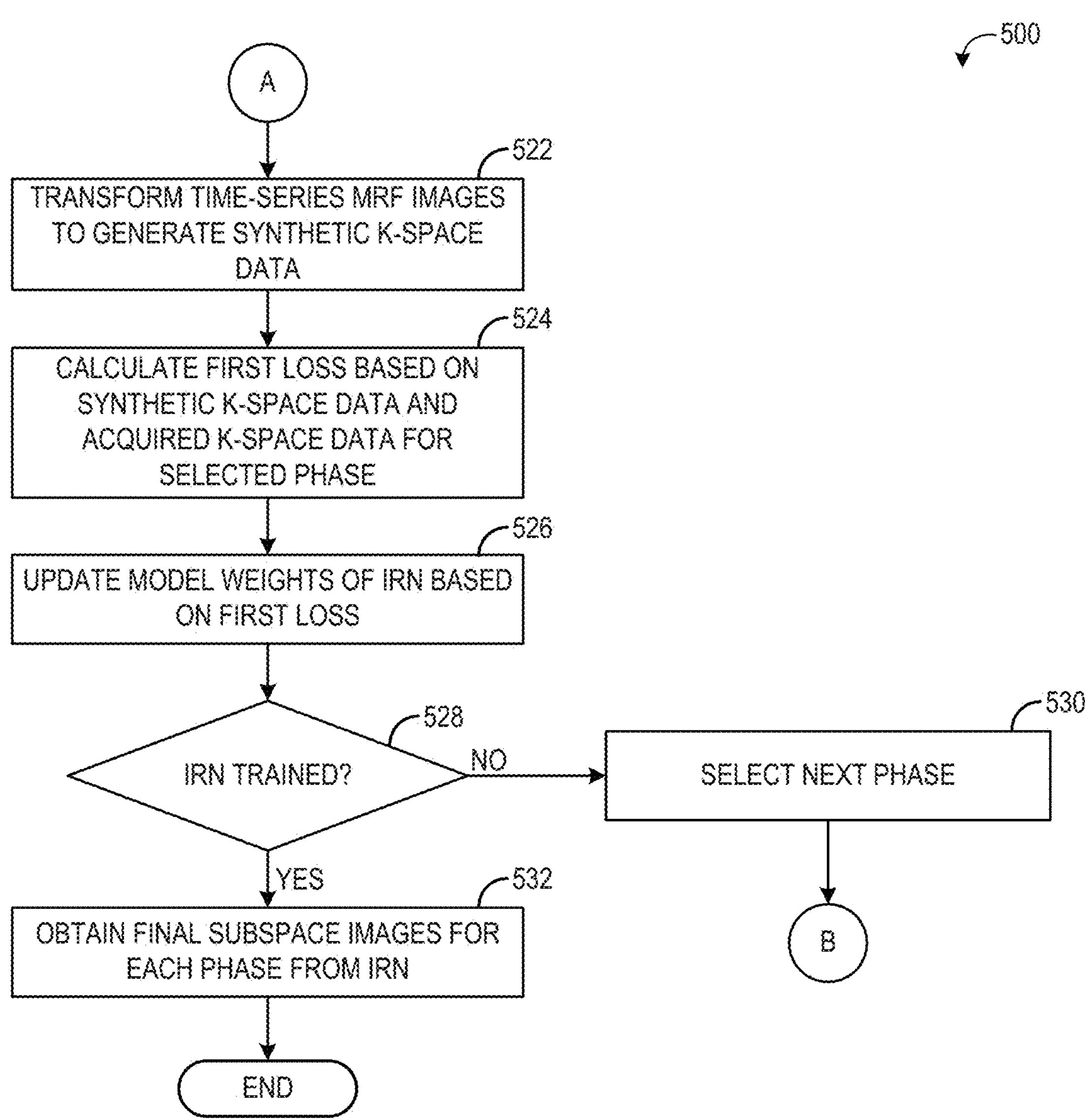

FIGS. 5A and 5B are a flow chart illustrating a method 500 for training an IRN of a cine MRF reconstruction system, according to an embodiment of the disclosure. Method 500 may be carried out according to instructions stored in memory of a computing system and executed by one or more processors of the computing system, such computing system 130 of FIG. 1, where the computing system is operably coupled to or included as part of an MRI system (e.g., MRI system 100 of FIG. 1). Method 500 may be executed to carry out the first training process 200 of FIG. 2, in some examples.

At 502, method 500 includes obtaining k-space data and an ECG signal of a cine MRF scan of a subject. The cine MRF scan may be carried out with the MRI system controlled to generate RF pulses and magnetic field gradient pulses that are played out in order to generate both $T_1$ and $T_2$ contrast over at least one (e.g., multiple) cardiac phases, such as by carrying out a FISP-based sequence with a breathhold of a specified duration (e.g., 11 seconds). The FISP-based sequence may include a variable flip angle (FA) pattern of half-sinusoidal lobes from 4 to 150 with 91 excitations per lobe. The entire scan may include 20 lobes with 1820 total excitations and a constant TE (1.4 ms) and TR (5.4 ms). An inversion may be applied before the first FA lobe, and $T_2$ preparations with durations of 30, 50, and 80 ms may be applied before the third, fourth, and fifth FA lobes, respectively. This pattern of preparation pulses may be repeated until the end of the scan with 2.7 s between each inversion. To obtain the k-space data, the data may be sampled using a variable density spiral with 24 interleaves to fully sample the central 25% of k-space and 48 interleaves to sample the entire k-space for a 192×192 matrix size and 300×300 $mm^2$ field of view (FOV). A pseudo golden angle ordering may be used, whereby the nominal rotation may be incremented by the golden angle (111°) every TR, and one of the 48 interleaves (equally spaced over 360°) may be selected that is closest to the nominal angle. The k-space data obtained as described herein may include k-space data for a single slice.

At 504, method 500 includes sorting the acquired k-space data into a plurality of phases using the ECG signal (e.g., retrospectively gating the k-space data). The ECG signal may be applied to retrospectively sort the k-space data into a plurality of cardiac phases (e.g., 12 phases, 24 phases) by dividing each RR interval of the ECG signal into bins of equal width (and then sorting the k-space data such that the k-space data obtained during a given bin is sorted into the phase corresponding to that bin). As the k-space data is acquired over multiple cardiac cycles, each cardiac phase may include k-space data from multiple cardiac cycles.

At 506, a first input tensor corresponding to a first phase and a last input tensor corresponding to a last phase are generated. As explained above with respect to FIG. 2, each of the first and last input tensors may be a 3D matrix of random values, and thus may be referred to as random-noise input tensors. The 3D matrix may include a set of feature maps (e.g., 32 feature maps) and each feature map may include a matrix of random values selected from a predefined range, such as −1 to 1 or −0.1 to 0.1. At 508, an interpolation is performed between the first and last input tensors to generate input tensors corresponding to each phase of the plurality of phases of the cardiac cycle (e.g., 24 phases and thus 24 input tensors including the first input tensor, the last input tensor, and 22 intermediate input tensors generated via the interpolation). Each input tensor may thereby include an $n_y \times n_x$ matrix size with d feature maps. The interpolation may be a linear interpolation performed on a per-pixel basis for each feature map, which may result in the simulation of cardiac motion across the tensors and facilitate more accurate output by the IRN.

At 510, a phase is selected. During the first iteration, the first phase may be selected, although any phase may be selected. At 512, the input tensor for the selected phase (e.g., the first input tensor when the first phase is selected) is entered as input to an untrained IRN. The untrained IRN may be initialized with random weights and biases. At 514, one or more subspace images output by the IRN are obtained. As explained with respect to FIG. 2, the IRN may be configured to output subspace images based on the input tensor. The subspace images are in the low-dimensional subspace derived from the MRF dictionary. As explained above, the SVD of the MRF dictionary is calculated. The right singular matrix is truncated to a rank of k (e.g., the $V_k$ matrix) that is determined from the singular values, e.g., the rank that retains 99.99% of the energy compared to the original (uncompressed) dictionary. The total energy is the sum of the squares of the singular values. The energy ratio is the fraction of energy retained in a rank-k approximation to the dictionary. A suitable energy ratio cutoff may be utilized, such as an energy ratio cutoff of 99.99%, which for the pulse sequence described above corresponds to a rank of k=17. The IRN may output 2*k feature maps (e.g., subspace images), as both real and imaginary parts are output. The subspace images output by the IRN may be used to train a PEN, as explained below with respect to FIG. 6.

At 516, the subspace images are processed in order to generate time-series MRF images. The subspace images may be processed to incorporate an MRF forward encoding model in the loss function that is ultimately used to update the IRN. Processing the subspace images may include applying coil sensitivity maps, as indicated at 518. For example, the k-space data may be acquired via multiple RF coils (e.g., 4 coils, 6 coils, etc.). A sensitivity map for each coil may be generated during a pre-scan calibration or based on the acquired k-space data. For each subspace image, that subspace image may be multiplied by each coil sensitivity map and combined in a suitable manner.

Processing the subspace images may further include, as indicated at 520, applying a temporal basis function ($V_k$) to transform the subspace images to time-series images. The temporal basis function may be the SVD of an MRF dictionary that includes combinations of $T_1$, $T_2$, and $B_1^+$ values. The MRF dictionary may be formed by Bloch equation simulation to create entries for $T_1$ between 60 and 4000 ms, $T_2$ between 6 and 1000 ms, and $B_1^+$ from 0.1 to 1.5 with a step size of 0.05, resulting in combinations of $T_1$, $T_2$, and $B_1^+$ (e.g., 590,875 combinations). Slice profile imperfections for a sinc-shaped RF pulse with a time bandwidth product of 2 and preparation pulse efficiency may be modeled in the dictionary and $B_1^+$ may be modeled as a scaling factor applied to the FA pattern (but not the preparation pulses). The MRF dictionary may be precomputed and stored in memory because the MRF scan is not prospectively triggered, so the subject's cardiac rhythm does not affect the sequence timings. The MRF dictionary may be compressed along the time dimension using an SVD. The compression threshold may be calculated to retain 99.99% of the energy of the uncompressed dictionary, resulting in a rank of 17. Let $D \in \mathbb{C}^{p \times t}$ represent a dictionary with t time points and p tissue property combinations. The compressed dictionary $D \in \mathbb{C}^{p \times t}$ with rank k may be obtained by multiplication with the truncated right singular matrix $V_k \in \mathbb{C}^{t \times k}$.

At 522 (shown in FIG. 5B), the time-series MRF images are transformed (e.g., with an NUFFT) to generate synthetic k-space data. As explained above with respect to FIG. 2, the generation of the synthetic k-space data may include applying a spiral undersampling mask (P) and density compensation factor (W) to the initial k-space data (e.g., to the output of the NUFFT).

At 524, a first loss is calculated based on the synthetic k-space data and the acquired k-space data for the selected phase. For example, when the first input tensor is input to the IRN, the acquired k-space data sorted into the bin corresponding to the first phase may be used to calculate the first loss. The acquired k-space data may be prepared by applying the density compensation factor (W) in order to shift the spiral k-space data to a Cartesian grid, as explained above with respect to FIG. 2, thereby expediting the transformation via the NUFFT and reducing the processing demands of training the IRN. The first loss may be calculated using a MSE loss function or another suitable loss function. At 526, the model weights of the IRN are updated based on the calculated first loss.

At 528, method 500 determines if the IRN is trained. The IRN may be determined to be trained when the calculated loss reaches a threshold value. In other examples, the IRN may be determined to be trained after a threshold number of iterations of the training process have been carried out (e.g., 20,000 iterations, 25,000 iterations, 29,000 iterations, etc.). If the IRN is not trained, method 500 proceeds to 530 to select a next phase and repeat the training process for a next iteration. For example, if the first iteration utilized the first phase (e.g., the first phase was selected at 510), the next phase may be the second phase. After selecting the next phase, method 500 returns to 512 to enter the input tensor for the selected phase (e.g., a second input tensor corresponding to the second phase) to the IRN and eventually calculate the loss function based on the synthetic k-space data (generated from the subspace images output by the IRN in response to the second input tensor) relative to the acquired k-space for the selected phase (e.g., the k-space data sorted into the bin corresponding to the second phase) and update the IRN based on the calculated loss.

If it is determined that the IRN is trained (e.g., the threshold number of iterations has been performed), method 500 proceeds to 532 to obtain final subspace images for each phase (or from one or more selected phases) from the IRN. For each selected phase, the input tensor corresponding to the selected phase may be input to the IRN, which will then output the final subspace images for the selected phase. In some examples, one set of final subspace images per selected phase may be obtained at 532. In other examples, the training process described above (e.g., from 512 to 530) may be repeated a threshold number of times (e.g., 1,000) and each of the output subspace images may be the final subspace images. The final subspace images may be used to obtain parameter maps, as explained in more detail below.

Figure 6:
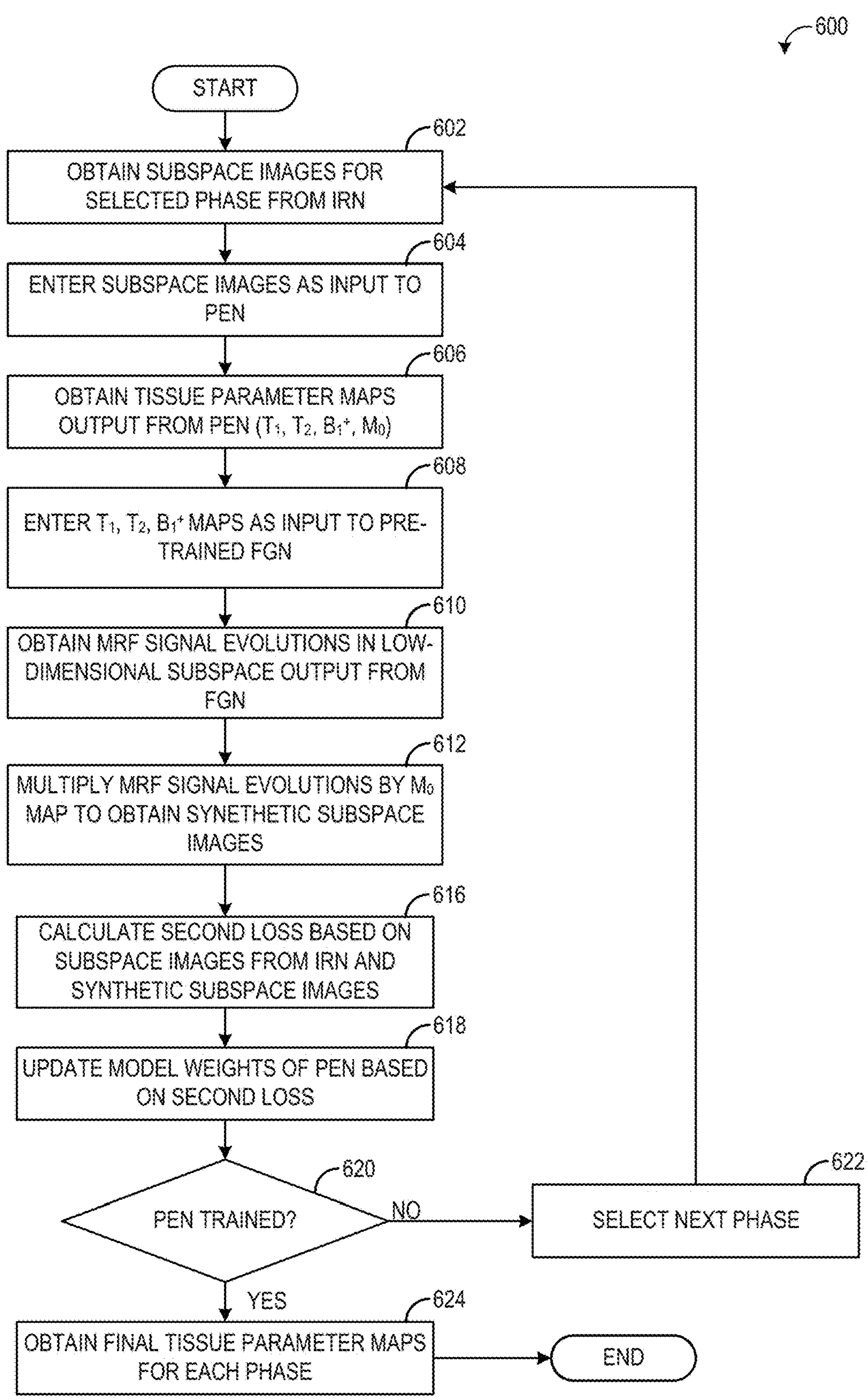
FIG. 6 is a flow chart illustrating an example method for training a parameter estimation network according to an embodiment of the disclosure.

FIG. 6 is a flow chart illustrating a method 600 for training a PEN of a cine MRF reconstruction system (e.g., cine MRF reconstruction system 135), according to an embodiment of the disclosure. Method 600 may be carried out according to instructions stored in memory of a computing device and executed by one or more processors of the computing device, such computing system 130 of FIG. 1, where the computing device is operably coupled to or included as part of an MRI system (e.g., MRI system 100 of FIG. 1). Method 600 may be executed to carry out the second training process 300 of FIG. 3, in some examples. Further, method 600 may be performed in parallel with method 500 (e.g., on the same device and at the same time or in succession), in some examples.

At 602, subspace images for a selected phase output by the IRN are obtained. During a first iteration of the training process for training the PEN, the subspace images output by the IRN during the first iteration of training the IRN may be obtained (e.g., the subspace images output at 514 of method 500). At 604, the subspace images are entered as input to the PEN. The PEN may be untrained and initialized with random weights and biases and configured to output tissue parameter maps. Thus, at 606, method 600 includes obtaining the tissue parameter maps output by the PEN, where the tissue parameter maps are generated based on the input subspace images and include $T_1$, $T_2$, $B_1^+$, and $M_0$ (both real and imaginary) maps. The PEN may have a suitable architecture, such as the example architecture shown in FIG. 8 and explained in more detail below.

At 608, the $T_1$, $T_2$, and $B_1^+$ maps are entered as input to a pre-trained fingerprint generation network (FGN). The FGN is trained to output MRF signal evolutions (e.g., fingerprints) as a function of the $T_1$, $T_2$, and $B_1^+$ values for each voxel. Thus, at 610, method 600 includes obtaining MRF signal evolutions, in low-dimensional subspace, output from the FGN. The FGN may have a suitable architecture, such as the example architecture shown in FIG. 9 and explained in more detail below. Utilization of the FGN eliminates the need for dictionary searching and thus expedites training of the PEN.

At 612, the MRF signal evolutions output from the FGN (e.g., the fingerprints for each voxel location) are multiplied by the complex-valued $M_0$ map to obtain synthetic subspace images. The complex-valued $M_0$ map is the combination of the real and imaginary parts of $M_0$.

At 616, a second loss is calculated based on the subspace images output by the IRN and the synthetic subspace images generated at 612. The second loss may be calculated using a MSE loss function or another suitable loss function. The model weights of the PEN are updated based on the second loss, as indicated at 618. It should be appreciated that the model weights of the IRN are not updated based on the second loss. Likewise, the model weights of the PEN are not updated based on the first loss determined in method 500. At 620, method 600 determines if the PEN is trained. The determination of whether the PEN is trained may be performed similarly to the determination of whether the IRN is trained, as explained above with respect to FIGS. 5A and 5B, e.g., based on the second loss reaching a threshold or a threshold number of iterations being performed. Because the PEN is trained in parallel with the IRN using the output of the IRN, the PEN may be determined to be trained once the IRN is determined to be trained or vice versa. If the PEN is not trained (e.g., the threshold number of iterations has not been reached), method 600 proceeds to 622 to select the next phase, and then method 600 returns to 602 to perform a next iteration of the training process by entering the subspace images of the selected phase (as output from the IRN) to the PEN, generating the synthetic subspace images from the tissue parameter maps output by the PEN, and updating the PEN based on the second loss calculated between the subspace images output by the IRN and the synthetic subspace images.

If it is determined at 620 that the PEN is trained, method 600 proceeds to 624 to obtain the final tissue parameter maps for each phase (or one or more selected phases) from the (trained) PEN. For each selected phase, the input tensor corresponding to the selected phase may be input to the IRN, which will then output the final subspace images for the selected phase. The final subspace images for the selected phase may then be input to the PEN to obtain the final tissue parameter maps. In some examples, one set of final tissue parameter maps per selected phase may be obtained at 624. In other examples, the training process described above (e.g., from 602 to 622) may be repeated a threshold number of times (e.g., 1,000) after it is determined at 620 that the PEN is trained and each of the output tissue parameter maps during the threshold number of iterations of the training process may be saved and combined (e.g., using a weighted average, such as an exponential average) to form the final tissue parameter maps. Additional details about obtaining the final tissue parameter maps and utilizing the final tissue parameter maps are provided below with respect to FIG. 7. It is to be appreciated that methods 500 and 600 described herein are applied to train the IRN and PEN to generate tissue parameter maps for a single slice of a subject. In some examples, additional slices of k-space data may be acquired and the training process (e.g., methods 500 and 600) may be repeated for each slice to generate tissue parameter maps for each slice. In this way, the IRN and PEN are trained in both a subject- and slice-specific manner.

Figure 7:
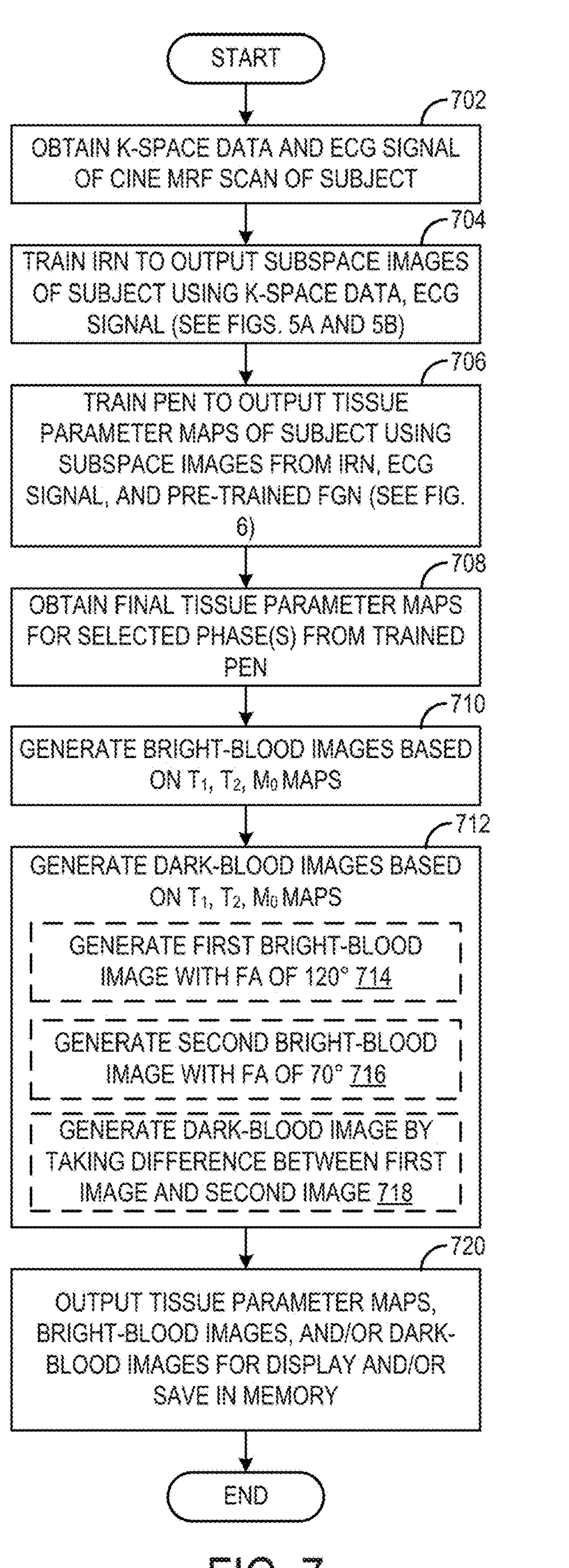
FIG. 7 is a flow chart illustrating an example method for deploying the image reconstruction network and parameter estimation network, as trained according to the methods of FIGS. 5A-6, according to an embodiment of the disclosure.

FIG. 7 is a flow chart illustrating a method 700 for generating $B_1^+$-corrected tissue parameter maps and/or synthetic images from data obtained during a cine MRF scan using a cine MRF reconstruction system (e.g., cine MRF reconstruction system 135), according to an embodiment of the disclosure. Method 700 may be carried out according to instructions stored in memory of a computing system and executed by one or more processors of the computing system, such computing system 130 of FIG. 1, where the computing system is operably coupled to or included as part of an MRI system (e.g., MRI system 100 of FIG. 1). Method 700 may be executed to carry out the high-level process 400 of FIG. 4, in some examples.

At 702, method 700 includes obtaining k-space data and an ECG signal of an MRF scan of a subject. The k-space data and ECG signal may be obtained as explained above with respect to FIG. 5A. At 704, an IRN of the cine MRF reconstruction system is trained to output subspace images of the subject using the k-space data and ECG signal. The training of the IRN is performed according to method 500 of FIGS. 5A and 5B. At 706, a PEN of the cine MRF reconstruction system is trained to output tissue parameter maps of the subject using the subspace images output by the IRN, the ECG signal of the subject, and a pre-trained FGN. The training of the PEN is performed according to method 600 of FIG. 6.

At 708, final tissue parameter maps for one or more selected phases (or each phase) are obtained from the trained PEN, as explained above with respect to FIG. 6. The final tissue parameter maps may include a $T_1$ map, a $T_2$ map, a $B_1^+$ map, and proton density maps (e.g., a real $M_0$ map and an imaginary $M_0$ map). Example tissue parameter maps that may be output by a trained PEN are shown in FIG. 10. At 710, method 700 includes generating bright-blood images based on the $T_1$, $T_2$, and $M_0$ maps. The final tissue parameter maps may thus be used to calculate synthetic cine images (e.g., the bright-blood images and/or dark-blood images as explained below) that approximate the contrast of traditional weighted images. These synthetic images may be segmented to quantify ventricular volumes and ejection fraction (EF), for example. Bright-blood images may be obtained by using the $T_1$, $T_2$, and $M_0$ maps to simulate a steady-state bSSFP sequence with flip angle $\alpha$=70° and TE=2 ms, such as according to the equation below.

$$S_{bSSFP} = M_0 \sin(\alpha) \frac{\exp\left(-\frac{TE}{T_2}\right)}{1 + \cos(\alpha) + (1 - \cos(\alpha))\left(\frac{T_1}{T_2}\right)} \quad \text{[eq. 5]}$$

At 712, method 700 includes generating dark-blood images based on the $T_1$, $T_2$, and $M_0$ maps. Dark-blood images are conventionally acquired using double inversion recovery. However, simulating the sequence used to obtain dark-blood images is not straightforward since it relies on properties of flowing blood. Thus, an approach may be used to approximate a dark-blood contrast by taking the difference between two synthetic bSSFP images with flip angles of 1200 and 70°. Accordingly, generating the dark-blood images may include generating a first bright-blood image with a FA of 120°, as indicated at 714, and generating a second bright-blood image with a FA of 70°, as indicated at 716. The first bright-blood image may be generated according to equation 5 above, using a flip angle $\alpha=120°$. A dark-blood image may be generated by taking the difference between the first bright-blood image and the second bright-blood image, as indicated at 718. Example bright-blood and dark-blood images that may be created from the tissue parameter maps output by a trained PEN are shown in FIG. 11.

At 720, the final tissue parameter maps, bright-blood images, and/or dark-blood images may be output for display on a display device (e.g., display device 136 of FIG. 1) and/or saved in memory (e.g., memory 134 of FIG. 1 and/or an image archive (e.g., as part of an exam of the subject), such as a picture archive and communication system (PACS), vendor neutral archive (VNA), or the like.

FIG. 8 is a schematic 800 of the parameter estimation network (PEN), which estimates quantitative maps from the subspace images. Before being input to the network, the subspace images are first vectorized to have size $n_y n_x$ (the batch dimension) by 2k (the channel dimension), where the channel dimension contains interleaved real and imaginary signal intensities from the k subspace images, and $n_y$ and $n_x$ are the spatial dimensions (number of voxels). The PEN may have two hidden layers with 300 nodes per layer. The output may have five channels corresponding to $T_1$, $T_2$, $B_1^+$, and the real and imaginary parts of the $M_0$ scaling term.

FIG. 9 is a schematic 900 of the fingerprint generator network (FGN). The FGN is a fully-connected network with two hidden layers. The input may include a $T_1$ value, a $T_2$ value, and a $B_1^+$ value. The output may be a vector of length 2k, where k is the rank of the MRF dictionary after SVD compression, which contains the interleaved real and imaginary parts of the fingerprint. As explained previously, the FGN is used to generate fingerprints for different $T_1$, $T_2$, and $B_1^+$ combinations. The FGN may be pre-trained using signal evolutions from the cine MRF dictionary (after compressing the dictionary along the time dimension using the SVD). Note that for cine MRF, the subject's cardiac rhythm does not affect the timings of the pulse sequence. Thus, the same MRF dictionary is used for all subjects regardless of their cardiac rhythm, and the FGN can be pre-trained.

FIG. 10 shows representative parameter maps 1000 of a healthy subject generated with conventional techniques and according to the embodiments disclosed herein (e.g., using the cine MRF reconstruction system). Panel A includes diastolic $T_1$ and $T_2$ maps generated using conventional modified Look-Locker inversion (MOLLI) and $T_2$-prep bSSFP sequences. Panel B includes $T_1$, $T_2$, and $M_0$ maps generated using MRF with prospective ECG triggering with a diastolic acquisition window reconstructed using a deep image prior (DIP). Cine MRF $T_1$, $T_2$, and $M_0$ maps are shown in diastolic and systolic phases using low-rank reconstruction (panel C), low-rank motion-corrected (LRMC) reconstruction (panel D), and DIP reconstruction (Panel E) without $B_1^+$ correction. Cine MRF maps using a DIP reconstruction with effective $B_1^+$ estimation (generated according to the methods disclosed herein, e.g., via the methods of FIGS. 5A-7) are presented in panel F. Maps are cropped to a central 96×96 region over the heart. The tissue parameter maps may show tissue parameter values in color to better illustrate the various tissue parameter values. For example, the color in the $T_1$ maps depict $T_1$ values (in ms) on a scale of 500-2000 ms with colors in a first range (e.g., red/violet/yellow); the color in the $T_2$ maps depict $T_2$ values (in ms) on a scale of 0-150 ms with colors in a second range (e.g., blue/green/yellow); the color in the $B_1^+$ maps depict $B_1^+$ values in arbitrary units on a scale of 0-1.5 with colors in the second range. The proton density maps are shown in gray-scale with varying shades of gray representing proton density in arbitrary units on a scale from 0-1.

Thus, FIG. 10 shows representative tissue parameter maps from one subject, including diastolic maps using ECG-triggered sequences (MOLLI, $T_2$-prep bSSFP, and MRF), as well as cine MRF maps in diastolic and systolic phases reconstructed using LR, LRMC, DIP, and DIP-B1 methods (wherein the DIP-B1 methods are the methods disclosed herein, e.g., the methods of FIGS. 5A-7). The LR reconstruction, with the tissue parameter maps shown in panel C, showed severe noise enhancement. The LRMC reconstruction, with the tissue parameter maps shown in panel D, exhibited noise enhancement to a lesser degree; however, slight motion blurring and a loss of high-resolution details were observed (e.g., in the small vessels in the liver and trabeculations in the heart). The DIP reconstruction, with the tissue parameter maps shown in panel E, provided excellent noise suppression and better delineation of high-resolution details compared to LRMC. With the DIP-B1 reconstruction, with the tissue parameter maps shown in panel F, the spatial homogeneity in the $T_1$ and $T_2$ maps improved in both myocardium and blood, as did the temporal homogeneity in myocardial $T_1$ and $T_2$ measured over the cardiac cycle. Thus, the cine MRF reconstruction system described herein is able to generate tissue parameter maps (e.g., $T_1$ and $T_2$ maps) with improved noise reduction and increased resolution relative to conventional techniques while also correcting for $B_1^+$ inhomogeneities, leading to improved spatial and temporal homogeneity of the $T_1$ and $T_2$ maps.

FIG. 11 shows synthetic cine images (e.g., bright-blood and dark-blood images) 1100 for the same subject as shown in FIG. 10. As in FIG. 10, FIG. 11 includes reference Cartesian cine bSSFP images in diastolic and systolic phases (panel A). Synthetic bright-blood bSSFP (top row) and dark-blood (bottom row) images derived from the cine MRF tissue property maps are presented using various reconstructions methods including low-rank (panel B), low-rank motion-corrected (panel C), deep image prior without effective $B_1^+$ estimation (panel D), and deep image prior with effective $B_1^+$ estimation as disclosed herein (panel E). Images are cropped to a central 96×96 region over the heart.

As appreciated from FIGS. 10 and 11, the cine MRF reconstruction system described herein provides a deep image prior reconstruction for 2D cine MRF $T_1$, $T_2$, and $M_0$ mapping with effective $B_1^+$ correction, which also provides synthetic bright-blood and dark-blood cine images. The deep image prior approach using the cine MRF reconstruction system described herein outperformed a low-rank (LR) subspace reconstruction and a low-rank reconstruction with non-rigid cardiac motion correction (LRMC), offering superior noise suppression and delineation of high-resolution features. The deep image prior approach using the cine MRF reconstruction system described herein also improved $T_1$ and $T_2$ mapping precision, with lower within-segment and intersegment variability, which was further enhanced when correcting for the effective $B_1^+$. Excellent agreement with reference cine measurements of ventricular volumes and ejection fraction was observed. The tissue parameter maps shown in panel F of FIG. 10 may be generated from k-space data a single slice with 24 cine phases at 1.6×1.6×8 $mm^3$ at 1.5 T during an 11-second breathhold. In healthy subjects, the average scan time for acquiring a short-axis stack of 2D multi-slice cine MRF data may be approximately 3.2 minutes compared to 2.5 minutes for a conventional cine protocol. Thus, the approach disclosed herein may enable simultaneous evaluation of myocardial tissue and cardiac function over the entire left ventricle in a scan time comparable to that of a conventional cine scan, which may help streamline CMR exams.

As explained above with respect to FIGS. 2-4 and 5A-7, network training (e.g., of the IRN and PEN) was performed de novo by enforcing consistency between the undersampled k-space data and the generated MRF subspace images and tissue parameter maps. The network weights were randomly initialized for each reconstruction, along with the input tensors to the IRN. This strategy of "zero-shot" deep learning is attractive for cardiac MRF because it avoids challenges with obtaining ground truth (e.g., fully-sampled) data for network training, which can be difficult due to long scan times and physiological motion. For cine MRF, multiple input tensors (one per cardiac phase) are used as input to the IRN. However, rather than use a plurality of input tensors as described herein, a 3D convolutional u-net that utilizes a single input and outputs subspace images for all cardiac phases may be utilized, though such an approach may be computationally intensive.

The cine MRF reconstruction system described herein also takes into account the impact of effective $B_1^+$ correction in cine MRF. The term "effective $B_1^+$" is used because it includes both the instantaneous $B_1^+$ (spatial variations in the RF transmit field) and time-cumulative $B_1^+$ (experienced by spins moving in and out of the excited slice volume) to mitigate through-plane motion and flow effects. These effects are important to consider for free-running 2D mapping sequences. Although the cine MRF scan may be performed with breathholds, through-plane motion due to cardiac contraction may cause deviations from the expected signal behavior. In addition, blood entering the slice volume will not have experienced previous RF excitations, leading to a lower effective $B_1^+$ in blood than myocardium. Correcting for the effective $B_1^+$ may improve the spatial homogeneity in the $T_1$ and $T_2$ maps, as evidenced by the lower within-segment variability and intersegment variability, and improved temporal homogeneity in $T_1$ and $T_2$ across cardiac phases. For example, without correcting for the effective $B_1^+$, inconsistent measurements may be obtained with some subjects showing higher $T_1$ or $T_2$ in different parts of the cardiac cycle. After accounting for the effective $B_1^+$, the reconstruction showed less variability with no significant difference between diastolic and systolic measurements.

Thus, the embodiments disclosed herein provide for deep image prior reconstruction for cine MRF using the cine MRF reconstruction system described herein, which uses neural networks to generate cardiac phase-resolved $T_1$, $T_2$, $M_0$, and effective $B_1^+$ maps without prior training, along with synthetic bright-blood and dark-blood cine images. The cine MRF reconstruction system outperformed low-rank and motion-corrected reconstructions, yielding improved noise suppression and improved $T_1$ and $T_2$ mapping precision. This approach has clinical implications for streamlining CMR exams by allowing rapid assessment of myocardial tissue and cardiac function during one acquisition.

The disclosure also provides support for a method for cine magnetic resonance fingerprinting (MRF), comprising: obtaining k-space data of an MRF scan of a subject, the k-space data acquired over a plurality of phases of at least one cardiac cycle of the subject, training an image reconstruction network (IRN) to output, for each phase of the plurality of phases, one or more subspace images of the subject using the k-space data, training a parameter estimation network (PEN) to output, for each phase of the plurality of phases, a set of tissue parameter maps of the subject using the one or more subspace images output by the IRN for that phase, upon training the IRN and the PEN, obtaining a final set of tissue parameter maps of the subject for one or more or each of the plurality of phases, and displaying and/or saving in memory the final set of tissue parameter maps for the one or more or each of the plurality of phases. In a first example of the method, training the IRN to output, for each phase of the plurality of phases, one or more subspace images of the subject using the k-space data comprises: sorting the k-space data into a plurality of bins, each bin corresponding to a respective phase of the plurality of phases, based on an electrocardiogram (ECG) signal of the subject, preparing a plurality of input tensors by generating a first input tensor comprising a first matrix of random values, generating a last input tensor comprising a last matrix of random values, and performing a linear interpolation between the first matrix of random values and the last matrix of random values to generate a plurality of intermediate input tensors, the plurality of input tensors comprising the first input tensor, the plurality of intermediate input tensors, and the last input tensor, and wherein each input tensor of the plurality of input tensors corresponds to a respective phase of the plurality of phases, and training the IRN to output, for each phase of the plurality of phases, the one or more subspace images of the subject using the sorted k-space data and the plurality of input tensors. In a second example of the method, optionally including the first example, training the IRN to output, for each phase of the plurality of phases, the one or more subspace images of the subject using the sorted k-space data and the plurality of input tensors comprises, for a first phase of the plurality of phases: entering the first input tensor as input to the IRN, the IRN configured to output one or more first subspace images based on the first input tensor, generating first synthetic k-space data from the one or more first subspace images, and updating the IRN based on a first loss calculated between the first synthetic k-space data and a first subset of the sorted k-space data, the first subset of the sorted k-space data including k-space data sorted into a first bin corresponding to the first phase. In a third example of the method, optionally including one or both of the first and second examples, the set of tissue parameter maps comprises a $T_1$ map, a $T_2$ map, a $B_1^+$ map, and proton density maps. In a fourth example of the method, optionally including one or more or each of the first through third examples, training the PEN to output, for each phase of the plurality of phases, the set of tissue parameter maps of the subject using the one or more subspace images output by the IRN for that phase comprises, for a first phase of the plurality of phases: entering one or more first subspace images output by the IRN as input to the PEN, the PEN configured to output a first set of tissue parameter maps based on the one or more first subspace images, generating one or more first synthetic subspace images from the first set of tissue parameter maps, and updating the PEN based on a second loss calculated between the one or more first synthetic subspace images and the one or more first subspace images output by the IRN. In a fifth example of the method, optionally including one or more or each of the first through fourth examples, generating one or more first synthetic subspace images from the first set of tissue parameter maps comprises: obtaining MRF signal evolutions based on the $T_1$ map, the $T_2$ map, and the $B_1^+$ map and using a pre-trained fingerprint generator network (FGN), and multiplying the MRF signal evolutions by the proton density maps to generate the one or more first synthetic subspace images. In a sixth example of the method, optionally including one or more or each of the first through fifth examples, the pre-trained FGN is pre-trained with an MRF dictionary comprising a plurality of MRF signal evolutions mapped to $T_1$, $T_2$, and $B_1^+$ values. In a seventh example of the method, optionally including one or more or each of the first through sixth examples, the method further comprises: generating a bright-blood image and/or a dark-blood image from the final set of tissue parameter maps for one or more or each of the plurality of phases.

The disclosure also provides support for a system for cine magnetic resonance fingerprinting (MRF), comprising: one or more processors, and memory storing an image reconstruction network (IRN), a parameter estimation network (PEN), a fingerprint generator network (FGN), and instructions executable by the one or more processors to: obtain k-space data of an MRF scan of a subject, the k-space data acquired over a plurality of phases of at least one cardiac cycle of the subject, prepare a plurality of input tensors, each input tensor of the plurality of input tensors corresponding to a respective phase of the plurality of phases, train the IRN to output, for each phase of the plurality of phases, one or more subspace images of the subject using the k-space data, the plurality of input tensors, and a first loss function, train the PEN to output, for each phase of the plurality of phases, a set of tissue parameter maps of the subject using the one or more subspace images output by the IRN for that phase, the FGN, and a second loss function, upon training the IRN and the PEN, obtain a final set of tissue parameter maps for one or more or each of the plurality of phases, and display and/or save in memory the final set of tissue parameter maps for the one or more or each of the plurality of phases. In a first example of the system, preparing the plurality of input tensors comprises generating a first input tensor comprising a first matrix of random values, generating a last input tensor comprising a last matrix of random values, and performing a linear interpolation between the first matrix of random values and the last matrix of random values to generate a plurality of intermediate input tensors, the plurality of input tensors comprising the first input tensor, the plurality of intermediate input tensors, and the last input tensor. In a second example of the system, optionally including the first example, training the PEN to output, for each phase of the plurality of phases, the set of tissue parameter maps of the subject using the one or more subspace images output by the IRN for that phase, the FGN, and the second loss function comprises, for a first phase of the plurality of phases: obtaining, with the FGN, MRF signal evolutions based on a first set of tissue parameter maps output by the PEN, processing the MRF signal evolutions to generate one or more synthetic subspace images, and updating the PEN by adjusting one or more weights of the PEN based on the second loss function, the second loss function determined based on the one or more synthetic subspace images and one or more first subspace images output by the IRN. In a third example of the system, optionally including one or both of the first and second examples, the FGN is pre-trained with an MRF dictionary comprising a plurality of MRF signal evolutions mapped to $T_1$, $T_2$, and $B_1^+$ values. In a fourth example of the system, optionally including one or more or each of the first through third examples, the set of tissue parameter maps comprises a $T_1$ map, a $T_2$ map, a $B_1^+$ map, and proton density maps. In a fifth example of the system, optionally including one or more or each of the first through fourth examples, the instructions are further executable to generate a bright-blood image and/or a dark-blood image from the final set of tissue parameter maps for one or more or each of the plurality of phases.

The disclosure also provides support for a method for cine magnetic resonance fingerprinting (MRF), comprising: generating, with a cine MRF reconstruction system, a final set of tissue parameter maps including a $T_1$ map, a $T_2$ map, and a $B_1^+$ map for each of a plurality of phases of a cardiac cycle of a subject, the cine MRF reconstruction system including an image reconstruction network (IRN), a parameter estimation network (PEN), and a pre-trained fingerprint generator network (FGN), the IRN and PEN trained de novo from k-space data of an MRF scan of the subject, a plurality of random-noise input tensors configured to simulate cardiac motion, and the FGN, the FGN pre-trained using an MRF dictionary comprising a plurality of MRF signal evolutions mapped to $T_1$, $T_2$, and $B_1^+$ values, and displaying and/or saving in memory the final set of tissue parameter maps. In a first example of the method, the method further comprises: generating a bright-blood image and/or a dark-blood image from the final set of tissue parameter maps for one or more or each of the plurality of phases. In a second example of the method, optionally including the first example, the IRN is trained to output, for each phase of the plurality of phases, one or more subspace images of the subject using the k-space data and the plurality of random-noise input tensors. In a third example of the method, optionally including one or both of the first and second examples, the PEN is trained to output, for each phase of the plurality of phases, the final set of parameter maps using the FGN and the one or more subspace images of the subject for that phase. In a fourth example of the method, optionally including one or more or each of the first through third examples map includes $T_1$ values depicted in a first color range and the $T_2$ map includes $T_2$ values depicted in a second color range. In a fifth example of the method, optionally including one or more or each of the first through fourth examples, the plurality of phases of the cardiac cycle of the subject comprises 24 phases.

As used herein, an element or step recited in the singular and preceded with the word "a" or "an" should be understood as not excluding plural of said elements or steps, unless such exclusion is explicitly stated. Furthermore, references to "one embodiment" of the present invention are not intended to be interpreted as excluding the existence of additional embodiments that also incorporate the recited features. Moreover, unless explicitly stated to the contrary, embodiments "comprising," "including," or "having" an element or a plurality of elements having a particular property may include additional such elements not having that property. The terms "including" and "in which" are used as the plain-language equivalents of the respective terms "comprising" and "wherein." Moreover, the terms "first," "second," and "third," etc. are used merely as labels, and are not intended to impose numerical requirements or a particular positional order on their objects.

This written description uses examples to disclose the invention, including the best mode, and also to enable a person of ordinary skill in the relevant art to practice the invention, including making and using any devices or systems and performing any incorporated methods. The patentable scope of the invention is defined by the claims, and may include other examples that occur to those of ordinary skill in the art. Such other examples are intended to be within the scope of the claims if they have structural elements that do not differ from the literal language of the claims, or if they include equivalent structural elements with insubstantial differences from the literal languages of the claims.

The invention claimed is:

1. A method for cine magnetic resonance fingerprinting (MRF), comprising:

obtaining k-space data of an MRF scan of a subject, the k-space data acquired over a plurality of phases of at least one cardiac cycle of the subject;

training an image reconstruction network (IRN) to output, for each phase of the plurality of phases, one or more subspace images of the subject using the k-space data, the training of the IRN comprising:

sorting the k-space data into a plurality of bins to form sorted k-space data, each bin corresponding to a respective phase of the plurality of phases, based on an electrocardiogram (ECG) signal of the subject;

preparing a plurality of input tensors by generating a first input tensor comprising a first matrix of random values, generating a last input tensor comprising a last matrix of random values, and performing a linear interpolation between the first matrix of random values and the last matrix of random values to generate a plurality of intermediate input tensors, the plurality of input tensors comprising the first input tensor, the plurality of intermediate input tensors, and the last input tensor, and wherein each input tensor of the plurality of input tensors corresponds to a respective phase of the plurality of phases; and training the IRN to output, for each phase of the plurality of phases, the one or more subspace images of the subject using the sorted k-space data and the plurality of input tensors;

training a parameter estimation network (PEN) to output, for each phase of the plurality of phases, a set of tissue parameter maps of the subject using the one or more subspace images output by the IRN for that phase;

upon training the IRN and the PEN, obtaining, using the trained IRN and the trained PEN, a final set of tissue parameter maps of the subject for one or more or each of the plurality of phases; and displaying and/or saving in memory the final set of tissue parameter maps for the one or more or each of the plurality of phases.

2. The method of claim 1, wherein training the IRN to output, for each phase of the plurality of phases, the one or more subspace images of the subject using the sorted k-space data and the plurality of input tensors comprises, for a first phase of the plurality of phases:

entering the first input tensor as input to the IRN, the IRN configured to output one or more first subspace images based on the first input tensor;

generating first synthetic k-space data from the one or more first subspace images; and updating the IRN based on a first loss calculated between the first synthetic k-space data and a first subset of the sorted k-space data, the first subset of the sorted k-space data including k-space data sorted into a first bin corresponding to the first phase.

3. The method of claim 1, wherein the set of tissue parameter maps comprises a $T_1$ map, a $T_2$ map, a $B_1^+$ map, and proton density maps.

4. The method of claim 3, wherein training the PEN to output, for each phase of the plurality of phases, the set of tissue parameter maps of the subject using the one or more subspace images output by the IRN for that phase comprises, for a first phase of the plurality of phases:

entering one or more first subspace images output by the IRN as input to the PEN, the PEN configured to output a first set of tissue parameter maps based on the one or more first subspace images;

generating one or more first synthetic subspace images from the first set of tissue parameter maps; and updating the PEN based on a second loss calculated between the one or more first synthetic subspace images and the one or more first subspace images output by the IRN.

5. The method of claim 4, wherein generating one or more first synthetic subspace images from the first set of tissue parameter maps comprises:

obtaining MRF signal evolutions based on the $T_1$ map, the $T_2$ map, and the $B_1^+$ map and using a pre-trained fingerprint generator network (FGN); and multiplying the MRF signal evolutions by the proton density maps to generate the one or more first synthetic subspace images.

6. The method of claim 5, wherein the pre-trained FGN is pre-trained with an MRF dictionary comprising a plurality of MRF signal evolutions mapped to $T_1$, $T_2$, and $B_1^+$ values.

7. The method of claim 1, further comprising generating a bright-blood image and/or a dark-blood image from the final set of tissue parameter maps for one or more or each of the plurality of phases.

8. A system for cine magnetic resonance fingerprinting (MRF), comprising:

one or more processors; and memory storing an image reconstruction network (IRN), a parameter estimation network (PEN), a fingerprint generator network (FGN), and instructions executable by the one or more processors to:

obtain k-space data of an MRF scan of a subject, the k-space data acquired over a plurality of phases of at least one cardiac cycle of the subject;

prepare a plurality of input tensors, each input tensor of the plurality of input tensors corresponding to a respective phase of the plurality of phases;

train the IRN to output, for each phase of the plurality of phases, one or more subspace images of the subject using the k-space data, the plurality of input tensors, and a first loss function;

train the PEN to output, for each phase of the plurality of phases, a set of tissue parameter maps of the subject using the one or more subspace images output by the IRN for that phase, the FGN, and a second loss function;

upon training the IRN and the PEN, use the trained IRN and the trained PEN to obtain a final set of tissue parameter maps for one or more or each of the plurality of phases;

display and/or save in memory the final set of tissue parameter maps for the one or more or each of the plurality of phases; and generate a bright-blood image and/or a dark-blood image from the final set of tissue parameter maps for one or more or each of the plurality of phases.

9. The system of claim 8, wherein preparing the plurality of input tensors comprises generating a first input tensor comprising a first matrix of random values, generating a last input tensor comprising a last matrix of random values, and performing a linear interpolation between the first matrix of random values and the last matrix of random values to generate a plurality of intermediate input tensors, the plurality of input tensors comprising the first input tensor, the plurality of intermediate input tensors, and the last input tensor.

10. The system of claim 8, wherein training the PEN to output, for each phase of the plurality of phases, the set of tissue parameter maps of the subject using the one or more subspace images output by the IRN for that phase, the FGN, and the second loss function comprises, for a first phase of the plurality of phases:

obtaining, with the FGN, MRF signal evolutions based on a first set of tissue parameter maps output by the PEN;

processing the MRF signal evolutions to generate one or more synthetic subspace images; and updating the PEN by adjusting one or more weights of the PEN based on the second loss function, the second loss function determined based on the one or more synthetic subspace images and one or more first subspace images output by the IRN.

11. The system of claim 10, wherein the FGN is pre-trained with an MRF dictionary comprising a plurality of MRF signal evolutions mapped to $T_1$, $T_2$, and $B_1^+$ values.

12. The system of claim 8, wherein the set of tissue parameter maps comprises a $T_1$ map, a $T_2$ map, a $B_1+$ map, and proton density maps.

13. A method for cine magnetic resonance fingerprinting (MRF), comprising:

generating, with a cine MRF reconstruction system, a final set of tissue parameter maps including a $T_1$ map, a $T_2$ map, and a $B_1^+$ map for each of a plurality of phases of a cardiac cycle of a subject, the cine MRF reconstruction system including an image reconstruction network (IRN), a parameter estimation network (PEN), and a pre-trained fingerprint generator network (FGN), the IRN and PEN trained de novo from k-space data of an MRF scan of the subject, a plurality of random-noise input tensors configured to simulate cardiac motion, and the FGN, the FGN pre-trained using an MRF dictionary comprising a plurality of MRF signal evolutions mapped to $T_1$, $T_2$, and $B_1^+$ values; and displaying and/or saving in memory the final set of tissue parameter maps.

14. The method of claim 13, further comprising generating a bright-blood image and/or a dark-blood image from the final set of tissue parameter maps for one or more or each of the plurality of phases.

15. The method of claim 13, wherein the IRN is trained to output, for each phase of the plurality of phases, one or more subspace images of the subject using the k-space data and the plurality of random-noise input tensors.

16. The method of claim 15, wherein the PEN is trained to output, for each phase of the plurality of phases, the final set of parameter maps using the FGN and the one or more subspace images of the subject for that phase.

17. The method of claim 13, wherein the $T_1$ map includes $T_1$ values depicted in a first color range and the $T_2$ map includes $T_2$ values depicted in a second color range.

18. The method of claim 13, wherein the plurality of phases of the cardiac cycle of the subject comprises 24 phases.

* * * * *